(12) United States Patent
Park et al.

(10) Patent No.: US 9,196,620 B2
(45) Date of Patent: Nov. 24, 2015

(54) SEMICONDUCTOR DEVICES AND METHODS OF MANUFACTURING THE SAME

(71) Applicant: Samsung Electronics Co., Ltd., Suwon-Si, Gyeonggi-Do (KR)

(72) Inventors: Je-Min Park, Suwon-si (KR); Dae-Ik Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 14/017,502

(22) Filed: Sep. 4, 2013

(65) Prior Publication Data

US 2014/0145268 A1 May 29, 2014

(30) Foreign Application Priority Data

Nov. 26, 2012 (KR) .......................... 10-2012-0134238

(51) Int. Cl.
| | |
|---|---|
| *H01L 29/78* | (2006.01) |
| *H01L 29/66* | (2006.01) |
| *H01L 27/108* | (2006.01) |
| H01L 29/423 | (2006.01) |
| H01L 23/485 | (2006.01) |
| H01L 23/522 | (2006.01) |
| H01L 21/768 | (2006.01) |

(52) U.S. Cl.
CPC .... *H01L 27/10894* (2013.01); *H01L 27/10888* (2013.01); *H01L 21/76831* (2013.01); *H01L 23/485* (2013.01); *H01L 23/5222* (2013.01); *H01L 29/4236* (2013.01); *H01L 29/78* (2013.01)

(58) Field of Classification Search
CPC ......... H01L 29/00; H01L 29/78; H01L 29/66; H01L 29/7831; H01L 29/66484; H01L 23/48; H01L 21/768; H01L 29/417; H01L 23/528
USPC .......................... 257/365, 296, 369, 499, 621
See application file for complete search history.

(56) References Cited

U.S. PATENT DOCUMENTS

| | | | |
|---|---|---|---|
| 6,426,247 B1 | 7/2002 | Divakaruni et al. | |
| 7,101,783 B2 | 9/2006 | Kim | |
| 8,072,074 B2 | 12/2011 | Hachisuka et al. | |
| 8,222,103 B1* | 7/2012 | Baars et al. | 438/239 |
| 2011/0316124 A1* | 12/2011 | Kawano | 257/621 |
| 2012/0153369 A1 | 6/2012 | Hwang | |
| 2013/0005141 A1* | 1/2013 | Park et al. | 438/653 |

(Continued)

FOREIGN PATENT DOCUMENTS

| | | |
|---|---|---|
| KR | 2001-0036018 A | 5/2001 |
| KR | 2001-0073791 A | 8/2001 |
| KR | 2005-0064460 A | 6/2005 |

(Continued)

*Primary Examiner* — Chuong A Luu
(74) *Attorney, Agent, or Firm* — Harness, Dickey & Pierce, P.L.C.

(57) ABSTRACT

A semiconductor device includes an insulating interlayer over a substrate in a first region, the insulating layer including contact holes exposing a portion of a surface of the substrate, and contact plugs in the contact holes. The contact plugs include a stacked structure of a first barrier metal layer pattern and a first metal layer pattern. The semiconductor device also includes second metal layer patterns directly contacting with the contact plugs and an upper surface of the insulating interlayer. The second metal layer pattern consists is a metal material layer.

10 Claims, 24 Drawing Sheets

(56) References Cited

U.S. PATENT DOCUMENTS

| | | | |
|---|---|---|---|
| 2013/0249045 A1* | 9/2013 | Kang et al. | 257/499 |
| 2014/0070426 A1* | 3/2014 | Park et al. | 257/774 |

FOREIGN PATENT DOCUMENTS

| | | | |
|---|---|---|---|
| KR | 10-0576461 B1 | 5/2006 |
| KR | 10-0609534 B1 | 8/2006 |
| KR | 10-0688059 B1 | 3/2007 |
| KR | 2010-0013948 A | 2/2010 |
| KR | 10-1019698 B1 | 3/2011 |
| KR | 10-1095739 B1 | 12/2011 |

\* cited by examiner

FIG. 20
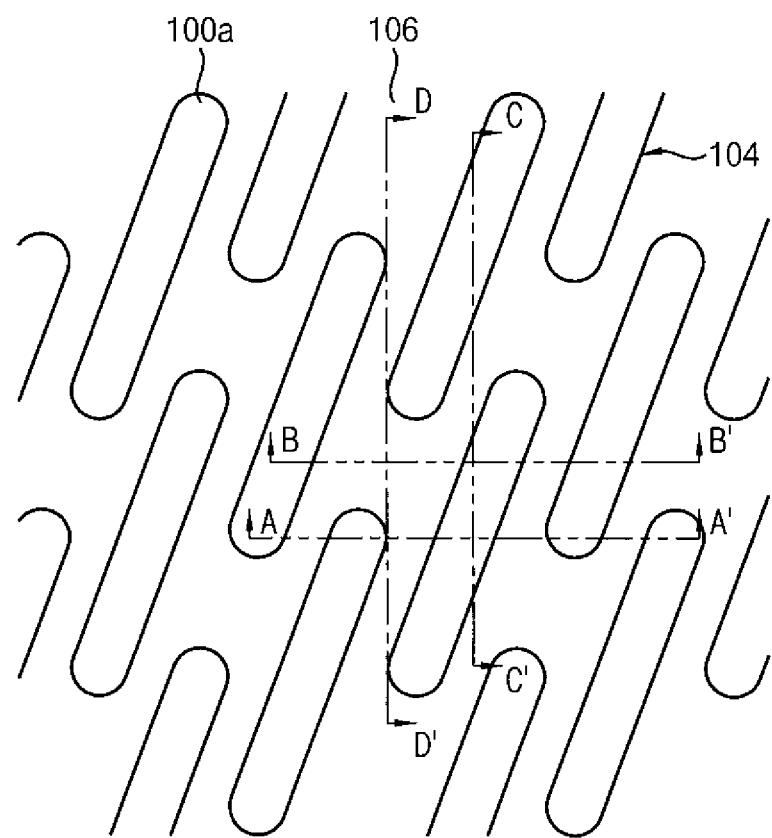
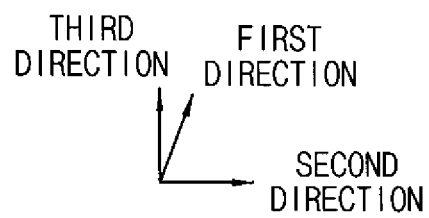

SEMICONDUCTOR DEVICES AND METHODS OF MANUFACTURING THE SAME

CROSS-REFERENCE TO RELATED APPLICATION

This application claims the benefit of priority under 35 USC §119 to Korean Patent Application No. 10-2012-0134238 filed on Nov. 26, 2012 in the Korean Intellectual Property Office (KIPO), the entire disclosure of which is incorporated herein by reference.

BACKGROUND

1. Field

Example embodiments relate to semiconductor devices and/or methods of manufacturing the same. More particularly, an example embodiment relates to methods of manufacturing a highly integrated DRAM device.

2. Description of the Related Art

Recently, semiconductor devices such as DRAM and the like have been highly integrated. According to the increase of an integration degree, the formation of wirings included in the semiconductor devices and the formation of switching devices having good performance are not easy. Thus, semiconductor devices including a wiring structure having low resistance and decreased parasitic capacitance between neighboring wirings, and switching devices having good properties, and methods of manufacturing the same are on demand.

SUMMARY

An example embodiment provides a semiconductor device including a wiring structure.

Another example embodiment provides a method of manufacturing the semiconductor device.

According to an example embodiment, there is provided a semiconductor device including an insulating interlayer over a substrate in a first region, the insulating interlayer including contact holes exposing a portion of a surface of the substrate, and contact plugs in the contact holes. The contact plugs include a stacked structure of a first barrier metal layer pattern and a first metal layer pattern. The semiconductor device also includes second metal layer patterns directly contacting the contact plugs and an upper surface of the insulating interlayer. The second metal layer pattern is a metal material layer.

In example embodiments, the semiconductor device may further include a gate insulating layer on the substrate in a second region, and a gate electrode structures each including a stacked structure of a lower gate pattern, a second barrier metal layer pattern, a third metal layer pattern and a fourth metal layer pattern on the gate insulating layer.

In example embodiments, the first and second barrier metal layer patterns may include the same materials.

In example embodiments, the second and fourth metal layer patterns may include the same metal materials.

In example embodiments, a height of the second metal layer pattern may be smaller than a height of a stacked structure of the third and fourth metal layer patterns.

In example embodiments, the second metal layer patterns may each have a line shape.

In example embodiments, the second metal layer patterns each may have an isolated island shape contacting a respective one of the contact plugs and the insulating interlayer.

In example embodiments, an area of a bottom region of each of the second metal layer patterns directly contacting a respective one of the contact plugs may be about 30% to about 70% of a total area of the bottom portion of each of the second metal layer patterns.

In example embodiments, the semiconductor device may further include inner spacers each on a side wall of a respective one of the contact holes. The inner spacers may include an insulating material.

According to another example embodiment, there is provided a method of manufacturing a semiconductor device. In the method, an insulating interlayer is formed over a substrate in a cell region, and a gate insulating layer and a lower gate electrode layer are formed on the substrate in a core/peripheral region. Then, the insulating interlayer is etched to form contact holes exposing a portion of a surface of the substrate in the cell region. A barrier metal layer and a first metal layer are sequentially formed on the insulating interlayer, in the contact holes and on the lower gate electrode layer. Contact plugs are formed each in a respective one of the contact holes by planarizing the barrier metal layer and the first metal layer in the cell region while the first metal layer remains in the core/peripheral region. The contact plugs each include a barrier metal layer pattern and a first metal layer pattern. A second metal layer is formed on the insulating interlayer, the contact plugs and the first metal layer in the core/peripheral region. The second metal layer is patterned to form second metal layer patterns directly contacting a respective one of the contact plugs and the insulating interlayer, and to form a fourth metal layer pattern in the core/peripheral region. The second metal layer pattern has a line shape in the cell region. Then, the first metal layer, the barrier metal layer and the lower electrode layer in the core/peripheral region are sequentially patterned to form a gate electrode structure including a stacked structure of a lower gate pattern, a second barrier metal layer pattern, a third metal layer pattern and a fourth metal layer pattern.

In example embodiments, after forming the contact holes, inner spacers each including an insulating material on a side wall of a respective one of the contact holes may be formed.

In example embodiments, the forming a lower gate electrode layer may include forming a polysilicon layer.

In example embodiments, the forming a first metal layer and the forming a second metal layer may include using a same metal.

In example embodiments, the barrier metal layer may include at least one selected from the group consisting of titanium, titanium nitride, tantalum and tantalum nitride.

In example embodiments, each of the first and second metal layers may include at least one selected from the group consisting of tungsten, aluminum and copper.

According to still another example embodiment, a semiconductor device includes an insulated bit line contact plug including a first metal layer pattern stacked over an ohmic contact layer pattern, and a metal bit line contact layer pattern over the insulated bit line contact plug. The metal bit line contact layer pattern directly contacts the ohmic contact layer pattern and the first metal layer pattern.

The ohmic contact layer pattern may be provided in an area excluding between the first metal layer pattern and the metal bit line contact layer pattern.

The ohmic contact layer pattern may have two integrally-formed prongs directly contacting the metal bit line contact layer pattern. An area of a surface of the first metal layer pattern directly contacting the metal bit line contact layer pattern may be greater than an area of a surface of the ohmic contact layer pattern directly contacting the metal bit line contact layer pattern.

An area of a bottom surface of the metal bit line contact layer pattern directly contacting the ohmic contact layer pattern and the first metal layer pattern, collectively, may be about 30% to about 70% of a total area of the bottom surface of the metal bit line contact layer pattern.

The semiconductor device may further include spacers each along both a sidewall of the insulated bit line contact plug and a sidewall of the metal bit line contact layer pattern, and an insulating interlayer with the insulated bit line contact plug and the spacers recessed therein.

In semiconductor devices in accordance with example embodiments, the height of wiring structures formed in a cell region may be decreased. Thus, the parasitic capacitance between the wiring structures may be decreased. In addition, transistors including a metal gate are included in a core/peripheral region of a substrate. Therefore, the semiconductor devices may be highly integrated and have high performance.

BRIEF DESCRIPTION OF THE DRAWINGS

Example embodiments will be more clearly understood from the following detailed description taken in conjunction with the accompanying drawings. FIGS. 1 to 30 represent non-limiting, example embodiments as described herein.

FIG. 1 is a perspective view illustrating a wiring structure of a semiconductor device in accordance with an example embodiment;

FIGS. 2 to 5 are perspective views illustrating a method of forming the wiring structure illustrated in FIG. 1;

FIG. 6 is a plan view illustrating a cell region of a semiconductor device in accordance with another example embodiment;

FIG. 7 is a cross-sectional view of a semiconductor device in accordance with the example embodiment shown in FIG. 6;

FIG. 8 is a cross-sectional view illustrating a bit line structure part and a gate structure part in FIG. 7;

FIGS. 9 to 19 are cross-sectional views for explaining a method of manufacturing a semiconductor device illustrated in FIG. 7;

FIGS. 20 to 22 are plan views corresponding to each cross-sectional view;

FIG. 23 is a perspective view illustrating a wiring structure of a semiconductor device in accordance with a yet further example embodiment;

FIG. 24 is a perspective view for illustrating a method of manufacturing a wiring structure of a semiconductor device in FIG. 23;

FIG. 25 is a cross-sectional view of a semiconductor device in accordance with still another example embodiment;

FIGS. 26 to 29 are cross-sectional views for explaining a method of manufacturing a semiconductor device illustrated in FIG. 25; and FIG. 30 is a block diagram illustrating a schematic constitution of a computing system in accordance with an example embodiment.

DETAILED DESCRIPTION OF THE EXAMPLE EMBODIMENTS

Figure 1:
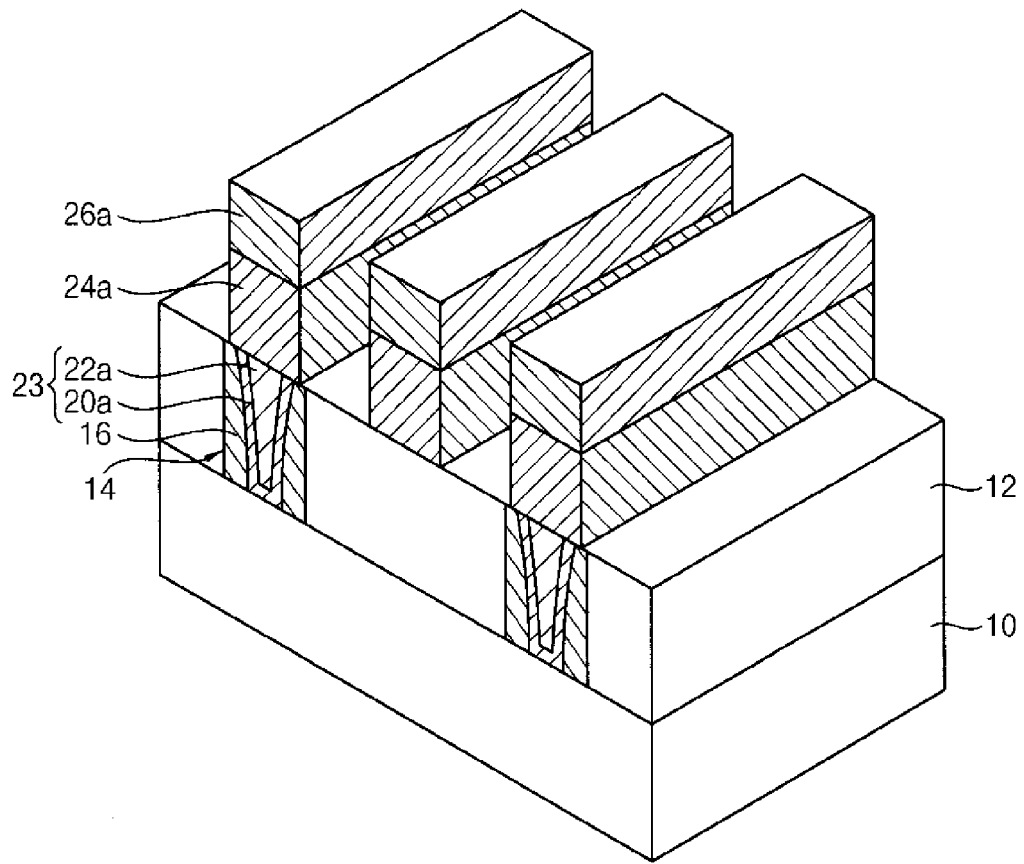

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Wiring Structure

FIG. 1 is a perspective view illustrating a wiring structure of a semiconductor device in accordance with an example embodiment.

Referring to FIG. 1, a substrate 10 including a semiconductor material may be prepared. On the substrate 10, devices such as a transistor may be formed.

On the substrate 10, an insulating interlayer 12 may be disposed. The insulating interlayer 12 may include silicon oxide. In the insulating interlayer 12, contact holes 14 exposing a portion of the surface of the substrate 10 may be included. The contact holes 14 are illustrated so as to expose a portion of the surface of the substrate 10. However, alternately, the contact holes 14 may have a shape exposing a semiconductor material such as a polysilicon pattern.

On the inner wall of the contact hole 14, an inner spacer 16 including an insulating material may be provided. The inner spacer 16 may include an insulating material having a high etching selectivity with respect to the insulating interlayer 12. For example, the inner spacer 16 may include silicon nitride. Because the inner spacer 16 is not an essential element, the inner spacer 16 may be omitted.

In each of the contact holes 14 including the inner spacer 16, a contact plug 23 may be provided. The contact plug 23 may include a barrier metal layer pattern 20a and a first metal layer pattern 22a.

The barrier metal layer pattern 20a may be formed along the side wall and the bottom portion of the contact hole 14. The barrier metal layer pattern 20a may have a shape directly contacting the surface of the substrate 10 exposed through the contact hole 14. Through providing the barrier metal layer pattern 20a, the contact plug 23 may make an ohmic contact with the substrate 10. Examples of materials that may be used for the barrier metal layer pattern 20a may include titanium, titanium nitride, tantalum, tantalum nitride, etc. These materials may be used alone or may be stacked two or more. Particularly, the barrier metal layer pattern 20a may have a stacked shape of a titanium layer and a titanium nitride layer.

The first metal layer pattern 22a may be provided on the barrier metal layer pattern 20a. The first metal layer pattern 22a may be positioned only in the contact hole 14 and may have a shape completely filling up the inner portion of the contact hole 14. In addition, the upper surface of the first metal layer pattern 22a may be positioned at the same plane as the upper surface of the insulating interlayer 12 and may have a planar shape. Examples of metal materials that may be used for the first metal layer pattern 22a may include tungsten, aluminum, copper, etc. These materials may be preferably used alone, however, may have a stacked structure of two or more. Particularly, the first metal layer pattern 22a may include tungsten.

A second metal layer pattern 24a extended while contacting the first metal layer pattern 22a and having a line shape, may be disposed on the insulating interlayer 12. Examples of metal materials that may be used for the second metal layer pattern 24a may include tungsten, aluminum, copper, etc. These materials may be preferably used alone, however, may have a stacked structure of two or more. Particularly, the second metal layer pattern 24a may include tungsten.

In order to achieve good adhesion properties of the first and second metal layer patterns 22a and 24a, the second metal layer pattern 24a may include the same metal material as the first metal layer pattern 22a. Alternatively, the second metal layer pattern 24a may include a different material from the first metal layer pattern 22a.

In addition, in order to obtain good adhesion properties of the second metal layer pattern 24a, the contacting area of the second metal layer pattern 24a and the contact plug 23 including the barrier metal layer pattern 20a may be preferably increased. The area of the bottom portion of the second metal layer pattern 22a directly contacting the contact plug 23 may be preferably about 30% to about 70% of the total area of the bottom portion of the second metal layer pattern 22a.

As illustrated in the drawing, a barrier metal layer may not be provided between the first and second metal layer patterns 22a and 24a. In addition, the barrier metal layer may not be provided between the second metal layer pattern 24a and the insulating interlayer 12. That is, the first and second metal layer patterns 22a and 24a may make a direct contact. In addition, the second metal layer pattern 24a and the upper surface of the insulating interlayer 12 may make a direct contact.

On the second metal layer pattern 24a, a hard mask pattern 26a may be provided. The hard mask pattern 26a may include silicon nitride.

As described above, because the barrier metal layer may not be provided between the first and second metal layer patterns 22a and 24a, and the second metal layer pattern 24a and the insulating interlayer 12, the height of an entire metal wiring may be decreased by the height of the barrier metal layer if formed. By decreasing the height of the metal wiring as described above, the parasitic capacitance between the second metal layer patterns 24a may be decreased.

FIGS. 2 to 5 are perspective views illustrating a method of forming the wiring structure illustrated in FIG. 1.

Figure 2:
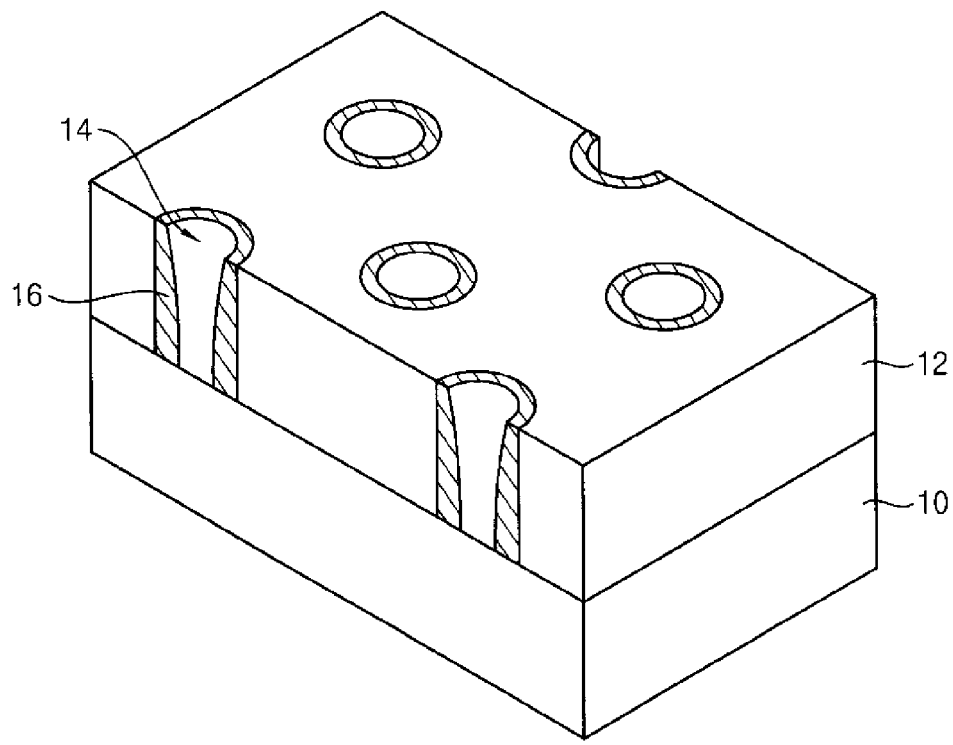

Referring to FIG. 2, an insulating interlayer 12 may be formed on a substrate 10. The insulating interlayer 12 may include silicon oxide. A portion of the insulating interlayer 12 may be etched to form contact holes 14 exposing a portion of the surface of the substrate 10.

On the inner wall and the bottom portion of the contact hole 14 and on the insulating interlayer 12, a spacer layer (not illustrated) including an insulating material may be formed. The spacer layer may include a material having a high etching selectivity with respect to the insulating interlayer. Particularly, the spacer layer may include silicon nitride. Then, the spacer layer may be anisotropically etched to form an inner spacer 16 on the inner wall of the contact hole 14. Alternatively, the inner spacer 16 may not be formed. In this case, the forming process of the inner spacer 16 may be omitted.

Figure 3:
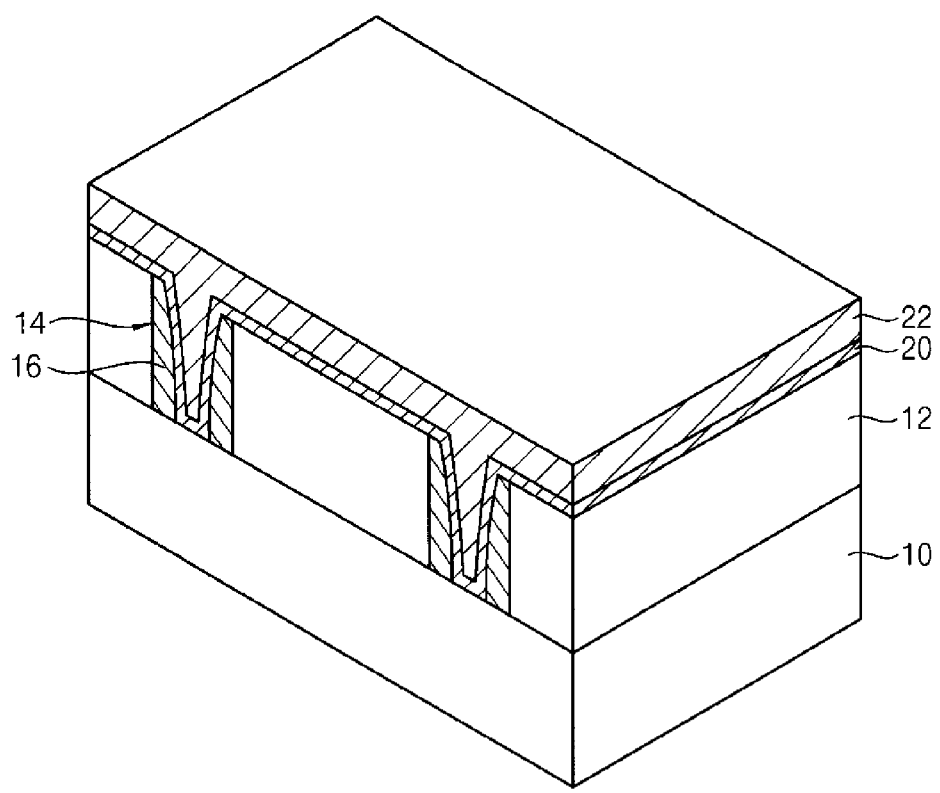

Referring to FIG. 3, a barrier metal layer 20 may be formed along the upper surface of the insulating interlayer 12, and on the inner wall and the surface portion of the contact holes 14 including the inner spacer 16. The barrier metal layer 20 may partially fill up a portion of the contact hole 14 and may be formed along the inner surface profile of the contact hole 14.

The barrier metal layer 20 may have a shape directly contacting the surface of the substrate 10 in the contact hole 14. Examples of materials that may be used for the barrier metal layer 20 may include titanium, titanium nitride, tantalum, tantalum nitride, etc. These materials may be used alone or may be stacked by two or more. Particularly, the barrier metal layer 20 may be formed by stacking a titanium layer and a titanium nitride layer.

On the barrier metal layer 20, a first metal layer 22 may be formed. Examples of metal materials that may be used for the first metal layer 22 may include tungsten, aluminum, copper, etc. These materials may be preferably used alone, however, may have a stacked structure of two or more. Particularly, the first metal layer 22 may include tungsten. The first metal layer 22 may be formed to a thickness of completely filling up the inner portion of the contact hole 14.

Figure 4:
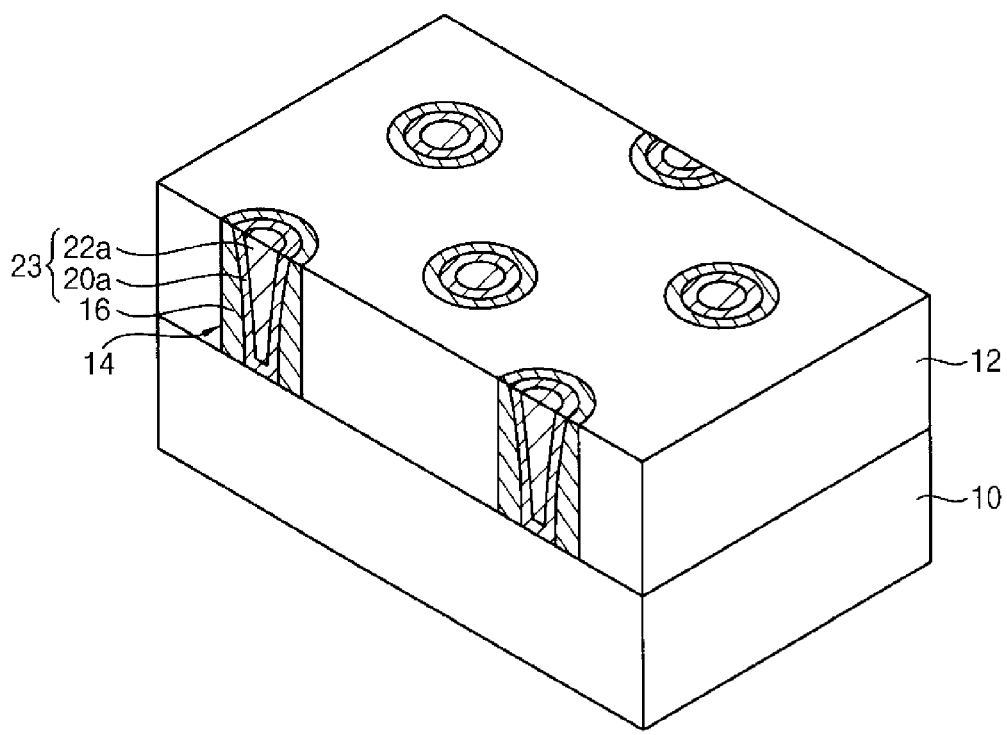

Referring to FIG. 4, the first metal layer 22 and the barrier metal layer 20 formed on the insulating interlayer 12 may be removed. The removing process may be performed through a chemical mechanical polishing process.

After the chemical mechanical polishing process, the first metal layer 22 and the barrier metal layer 20 may remain in the contact hole 14. Thus, in the contact hole 14, a contact plug 23 of the stacked structure of the barrier metal layer pattern 20*a* and the first metal layer pattern 22*a* may be formed. The upper surface of the insulating interlayer 12 may be exposed.

Figure 5:
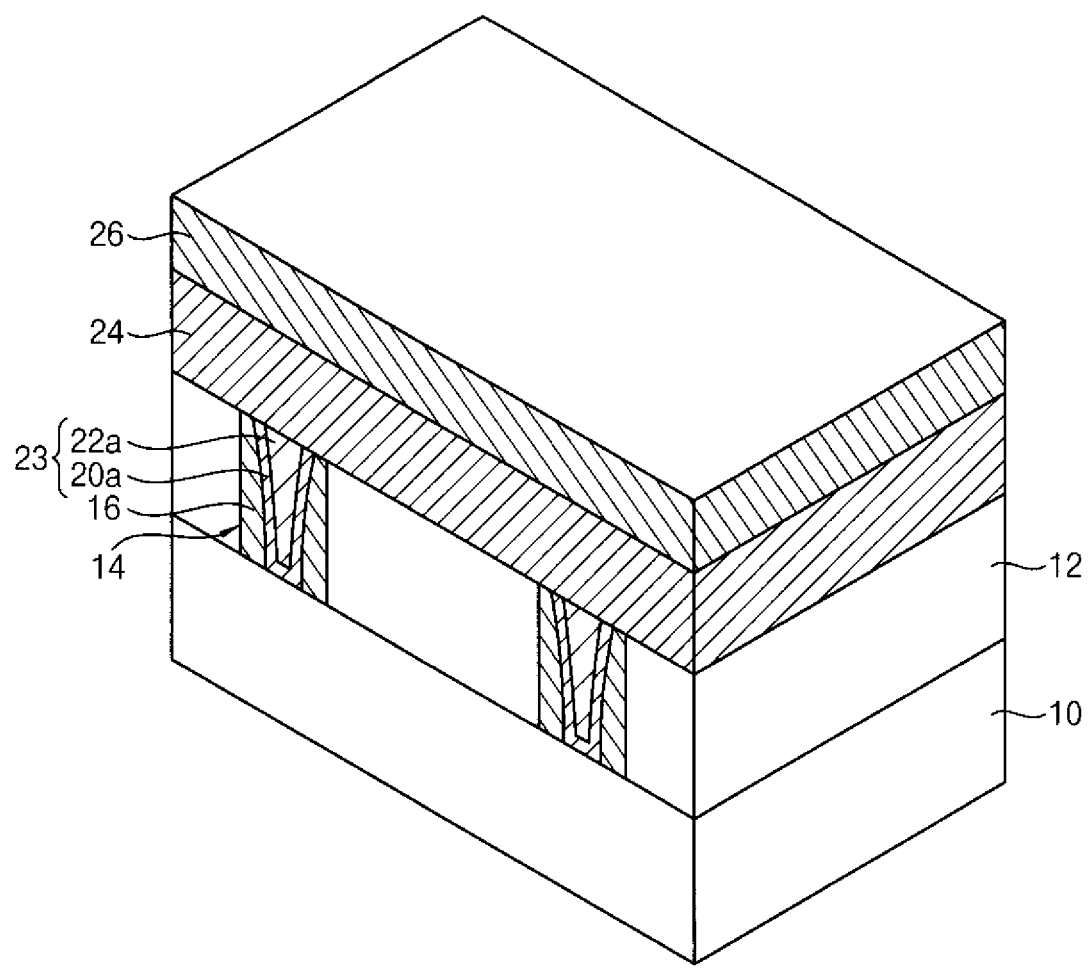

Referring to FIG. 5, a second metal layer 24 may be formed on the contact plugs 23 and the insulating interlayer 12. The second metal layer 24 may be formed through a chemical vapor deposition process or a physical vapor deposition process. Examples of metal materials that may be used for the second metal layer 24 may include tungsten, aluminum, copper, etc. These materials may be preferably used alone or may have a stacked structure of two or more. Particularly, the second metal layer 24 may include tungsten.

In order to improve good adhesion properties of the first and second metal layers 22*a* and 24, the second metal layer 24 may preferably include the same metal material as the first metal layer pattern 22*a*. Alternatively, the second metal layer 24 may include a different metal material from the first metal layer pattern 22*a*.

As illustrated in FIG. 5, on the upper surface of the insulating interlayer 12 and the first metal layer pattern 22*a*, the second metal layer 24 may make a direct contact. That is, a barrier metal layer may not be formed between the insulating interlayer 12 and the second metal layer 24. In addition, the barrier metal layer may not be formed between the first metal layer pattern 22*a* and the second metal layer 24.

A hard mask layer 26 may be formed on the second metal layer 24. The hard mask layer 26 may include silicon nitride.

Referring to FIG. 1 again, the hard mask layer 26 may be patterned to form a hard mask pattern 26*a*. The hard mask pattern 26*a* may have a line shape and may be positioned above the contact plug 23.

The second metal layer 24 may be etched by using the hard mask pattern 26*a* as an etching mask. Through the etching process, a second metal layer pattern 24*a* extended while contacting the contact plug 23 and having a line shape may be formed. In this case, the area of the bottom portion of the second metal layer pattern 22*a* directly contacting the contact plug 23 may be preferably about 30% to about 70% based on the total area of the bottom portion of the second metal layer pattern 22*a*.

As described above, the barrier metal layer may not be provided between the first and second metal layer patterns 22*a* and 24*a*. In addition, the barrier metal layer may not be provided between the second metal layer pattern 24*a* and the insulating interlayer 12. Therefore, the height of a total metal wiring may be decreased by the height of the barrier metal layer if formed. Because the height of the metal wiring may be decreased as described above, the generation of parasitic capacitance between the second metal layer patterns may be decreased.

Semiconductor Device

The wiring structure illustrated in FIG. 1 may be used in various types of semiconductor devices. Hereinafter, a DRAM device including the wiring structure is described.

Figure 6:
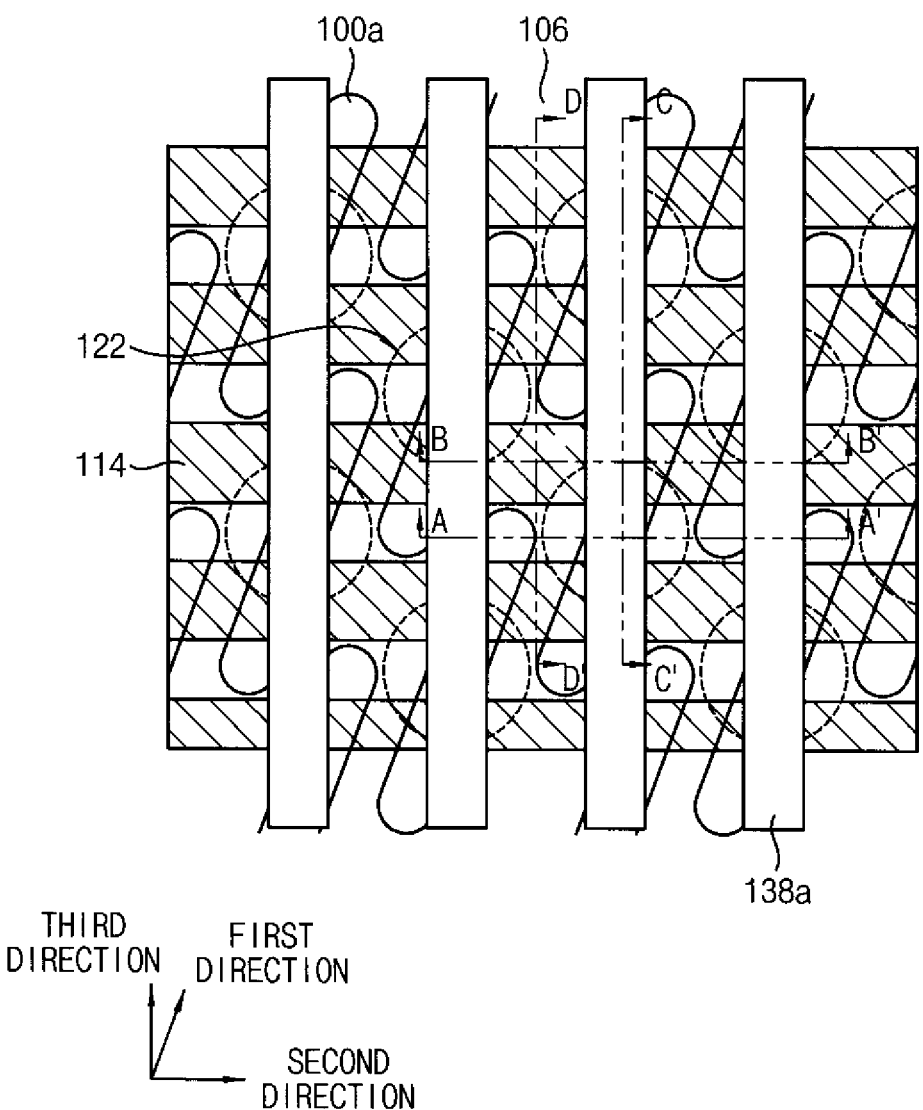
Figure 7:
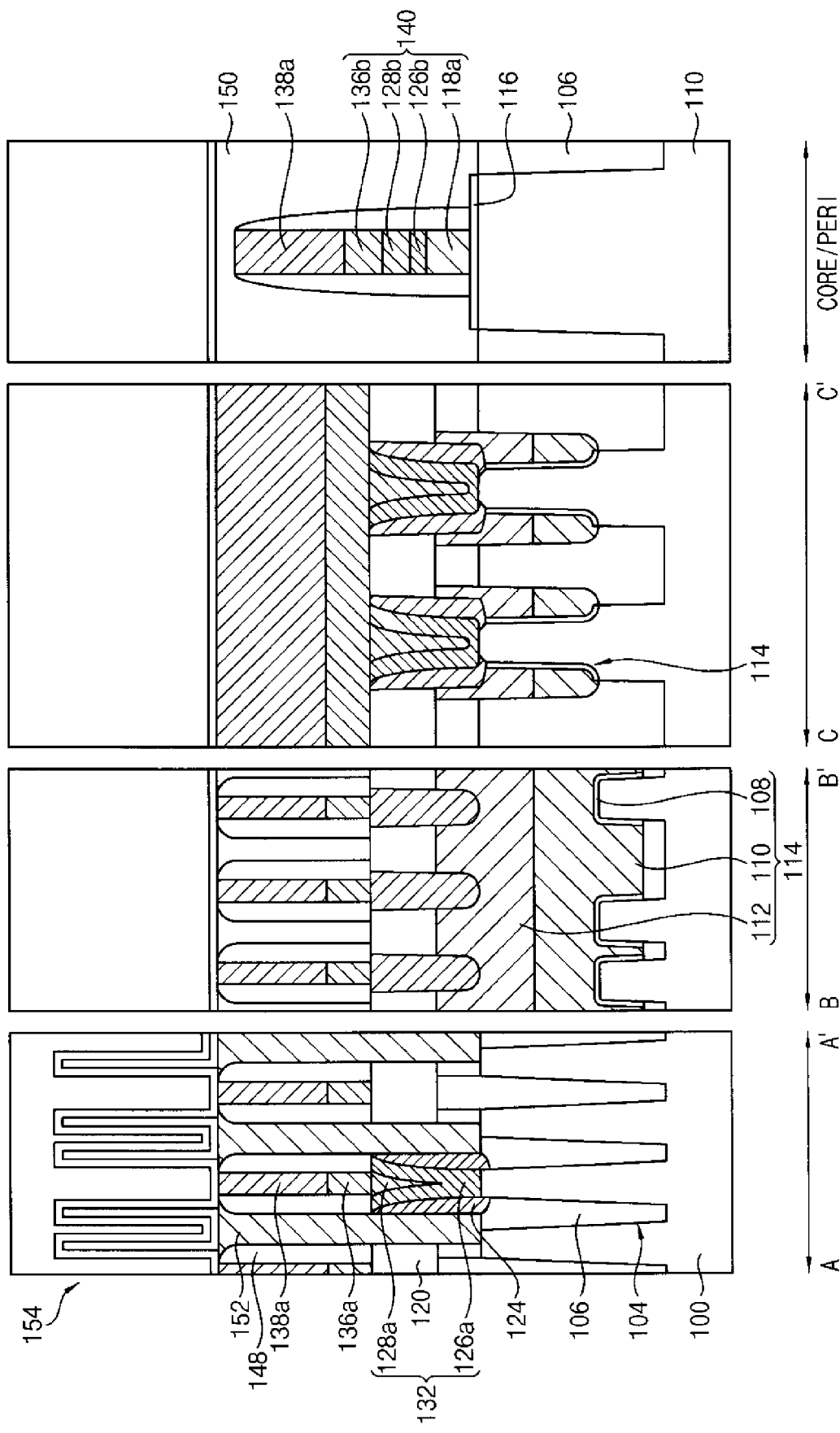
Figure 8:
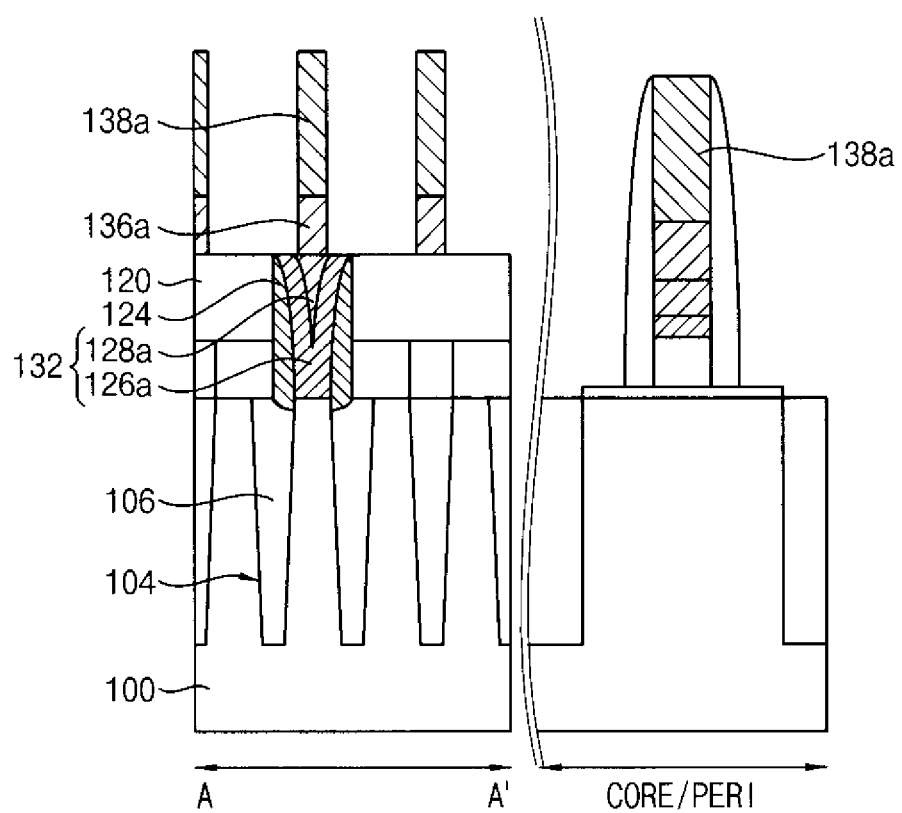

FIG. 6 is a plan view illustrating a cell region of a semiconductor device in accordance with another example embodiment. FIG. 7 is a cross-sectional view of a semiconductor device in accordance with the example embodiment shown in FIG. 7. FIG. 8 is a cross-sectional view illustrating a bit line structure part and a gate structure part in FIG. 7.

The cross-sectional views described hereinafter may be obtained by cutting along lines A-A', B-B', C-C' and D-D' in FIG. 6, and a core/peripheral region. In the description below, the longitudinal direction of an active region may be the first direction, the extended direction of a buried gate structure may be the second direction, and the vertical direction to the second direction may be the third direction.

Referring to FIGS. 6 to 8, a substrate 100 divided into a cell region and a peripheral circuit region, and including a semiconductor material may be provided. At the substrate 100, device isolation layer patterns 106 may be formed, and the surface of the substrate 100 may be divided into an active region 100*a* and a field region.

Hereinafter, the devices formed on the substrate 100 in the cell region are described first.

Each of the active regions 100*a* included in the cell region may have an isolated island shape having a longitudinal direction in the first direction and may be disposed in parallel in the first direction. At the substrate 100 in the cell region, trenches for gate may be formed. In the trench for gate, a buried gate structure 114 having an extended line shape in the second direction may be provided.

The active region 100*a* may include a first contact forming region on the upper surface of the center portion thereof and second and third contact forming regions respectively on the upper surfaces of both edge portions thereof. The first to third contact forming regions may be divided by the buried gate structures 114.

The first direction, which is the longitudinal direction of the active region 100*a* may not be perpendicular to the second direction. That is, the first direction may be diagonal with respect to the second direction. In addition, the active regions 100*a* may be disposed in a row in parallel in the first direction.

The trenches for gate may be disposed with a certain distance in parallel to each other. The buried gate structure 114 may include a first gate insulating layer 108, a buried gate electrode 110 and an insulating layer pattern 112. The first gate insulating layer 108 may be provided on the inner surface of the trench for gate. The buried gate electrode 110 may include a metal material or a polysilicon material. Particularly, the buried gate electrode 110 may have a stacked structure of a barrier metal layer and a metal layer. The insulating layer pattern 112 may be provided on the buried gate electrode 110 and have a shape filling up the upper portion of the trench for gate. The insulating layer pattern 112 may be formed as a nitride layer.

On the substrate 100 in the cell region including the buried gate electrode 110 therein, a first insulating interlayer 120 may be provided. The first insulating interlayer 120 may include silicon oxide. The first insulating interlayer 120 may include first contact holes 122 exposing the surface of the substrate 100 in the first contact forming region.

On the inner wall of the first contact hole 122, an inner spacer 124 including an insulating material may be provided. The inner spacer 124 may include an insulating material having a high etching selectivity with respect to the first insulating interlayer. Particularly, the inner spacer 124 may include silicon nitride.

A first barrier metal layer pattern 126a contacting the surface of the inner spacer 124 and the substrate 100 in the first contact forming region may be disposed. The first barrier metal layer pattern 126a may be disposed only in the first contact hole 122. Examples of materials that may be used for the first barrier metal layer pattern 126a may include titanium, titanium nitride, tantalum, tantalum nitride, etc. These materials may be used alone, or two or more materials may be stacked. Particularly, the first barrier metal layer pattern 126a may have a stacked shape of a titanium layer and a titanium nitride layer.

On the first barrier metal layer pattern 126a, a first metal layer pattern 128a may be provided. The first metal layer pattern 128a may be positioned only in the first contact hole 122 and may have a shape completely filling up the inner portion of the first contact hole 122. The upper surface of the first metal layer pattern 128a may be positioned at the same plane as the upper surface of the first insulating interlayer 120 and have a planar shape. Examples of metal materials that may be used for the first metal layer pattern 128a may include tungsten, aluminum, copper, etc. These materials may be preferably used alone, or a stacked structure of two or more may be also used. Particularly, the first metal layer pattern 128a may include tungsten.

The first barrier metal layer pattern 126a and the first metal layer pattern 128a positioned in the first contact hole 122 may be provided as a bit line contact 132. Because the first barrier metal layer pattern 126a has a shape directly contacting the surface of the substrate 100, the bit line contact 132 may make an ohmic contact. In addition, although having of the first barrier metal layer pattern 126a, the first metal layer pattern 128a may make a strong adhesion.

A second metal layer pattern 136a extended in the third direction while contacting the first metal layer pattern 128a and having a line shape may be provided on the first insulating interlayer 120. Examples of metal materials that may be used for the second metal layer pattern 136a may include tungsten, aluminum, copper, etc. These materials may be preferably used alone, or a stacked structure of two or more may be used. Particularly, the second metal layer pattern 136a may include tungsten.

In order to obtain good adhesion properties of the first and second metal layer patterns 128a and 136a, the second metal layer pattern 136a may preferably include the same metal material as the first metal layer pattern 128a. Alternatively, the second metal layer pattern 136a may include a different metal material from the first metal layer pattern 128a. The second metal layer pattern 136a may be provided as a bit line.

Between the first and second metal layer patterns 128a and 136a, the barrier metal layer may not be provided. In addition, between the second metal layer pattern 136a and the first insulating interlayer 120, the barrier metal layer may not be provided. The first and second metal layer patterns 128a and 136a may have a shape making a direct contact with each other. In addition, the second metal layer pattern 136a and the upper surface of the first insulating interlayer 120 may have a shape making a direct contact with each other.

The bottom portion of the second metal layer pattern 136a provided as one bit line may include a region directly contacting the bit line contact 132 and a region directly contacting the first insulating interlayer 120, respectively. The bit line 136a may make a stronger adhesion at the upper surface of the bit line contact 132 than the upper surface of the first insulating interlayer 120. Therefore, as contacting region of the bottom portion of the bit line 136a and the bit line contact 132 increases, metal lifting defects may be decreased. To decrease the metal lifting defects, the area of direct contacting region of bit line contact 132 and the bottom portion of one bit line 136a may be preferably 30% or over with respect to the total area of the bottom portion of one bit line 136a. In an example embodiment, the area of direct contacting region of bit line contact 132 and bottom portion of one bit line 136a may be about 30% to about 70% with respect to the total area of the bottom portion of one bit line 136a.

On the second metal layer pattern 136a, a hard mask pattern 138a may be provided. The hard mask pattern 138a may include silicon nitride.

As described above, the bit line 136a may exclude the barrier metal layer pattern, but may be constituted only with the second metal layer pattern 136a. Therefore, the height of a wiring structure of the bit line 136a may be decreased by the thickness of the barrier metal layer pattern if formed. According to the decrease of the height of the bit line 136a, the parasitic capacitance between the bit lines 136a may be largely decreased.

On both of the side walls of the bit line 136a and the hard mask pattern 138a, insulating spacers 148 may be provided. A second insulating interlayer 150 filling up a gap between the bit lines 136a may be provided. In addition, the second insulating interlayer 150 may have a shape covering a gate electrode structure formed in the core/peripheral region.

A storage node contact 152 penetrating the second insulating interlayer 150 and the first insulating interlayer 120 and contacting on the substrate in the second and third contact forming regions, respectively, may be provided. On the storage node contact 152, each of capacitors 154 may be provided.

Meanwhile, peripheral circuits including a MOS transistor may be provided on the substrate 100 in the core/peripheral region. Hereinafter, devices provided on the substrate 100 in the core/peripheral region are described.

As illustrated in FIGS. 7 and 8, a second gate insulating layer 116 may be provided on the substrate 100 of active regions included in the core/peripheral region. The second gate insulating layer 116 may include silicon oxide.

On the second gate insulating layer, a gate electrode structure 140 of a stacked structure of a lower gate pattern 118a, a second barrier metal layer pattern 126b, a third metal layer pattern 128b and a fourth metal layer pattern 136b may be provided. The lower gate pattern 118a may include polysilicon. The second barrier metal layer pattern 126b may be formed by the same material as the first barrier metal layer pattern 126a, the third metal layer pattern 128b may include the same material as the first metal layer pattern 128a, and the fourth metal layer pattern 136b may include the same material as the second metal layer pattern 136a. On the gate electrode structure 140, the hard mask pattern 138a may be provided. The fourth metal layer pattern 136b may have substantially the same height as the second metal layer pattern 136a.

As described above, because the gate electrode structure 140 has a stacked shape of the third and fourth metal layer patterns 128b and 136b, the thickness of the gate electrode structure 140 may be greater than that of the bit line 136a including only the second metal layer pattern 136a in the cell region.

As described above, the height of the bit line may be decreased in the semiconductor device according to example embodiments. Thus, parasitic capacitance between the bit lines may be decreased. In addition, a transistor including a metal gate having a greater thickness than the bit line may be provided in the core/peripheral region. Accordingly, the semiconductor device according to example embodiments may exhibit high performance.

Figure 21:
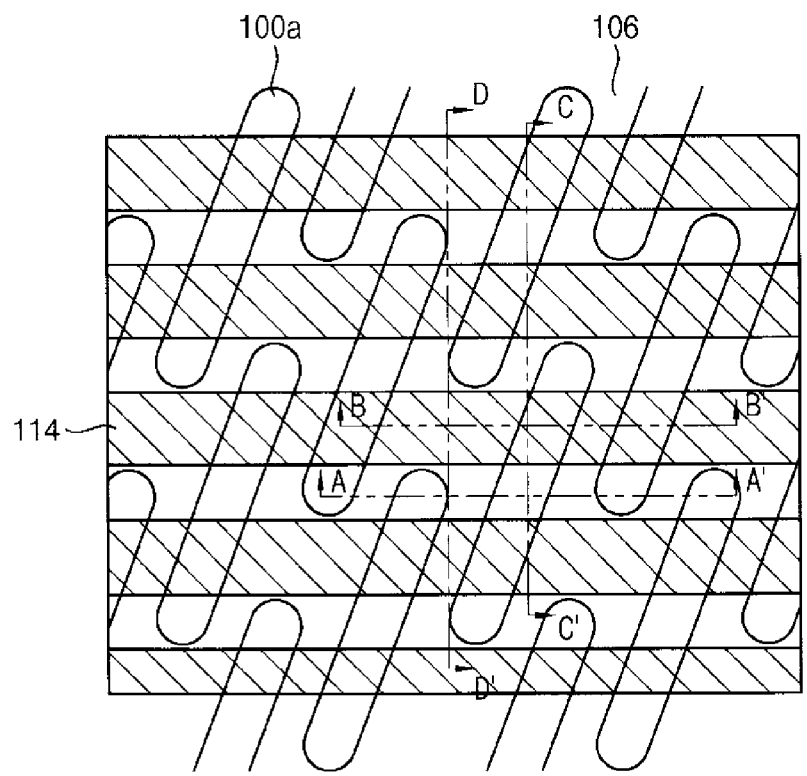
Figure 22:
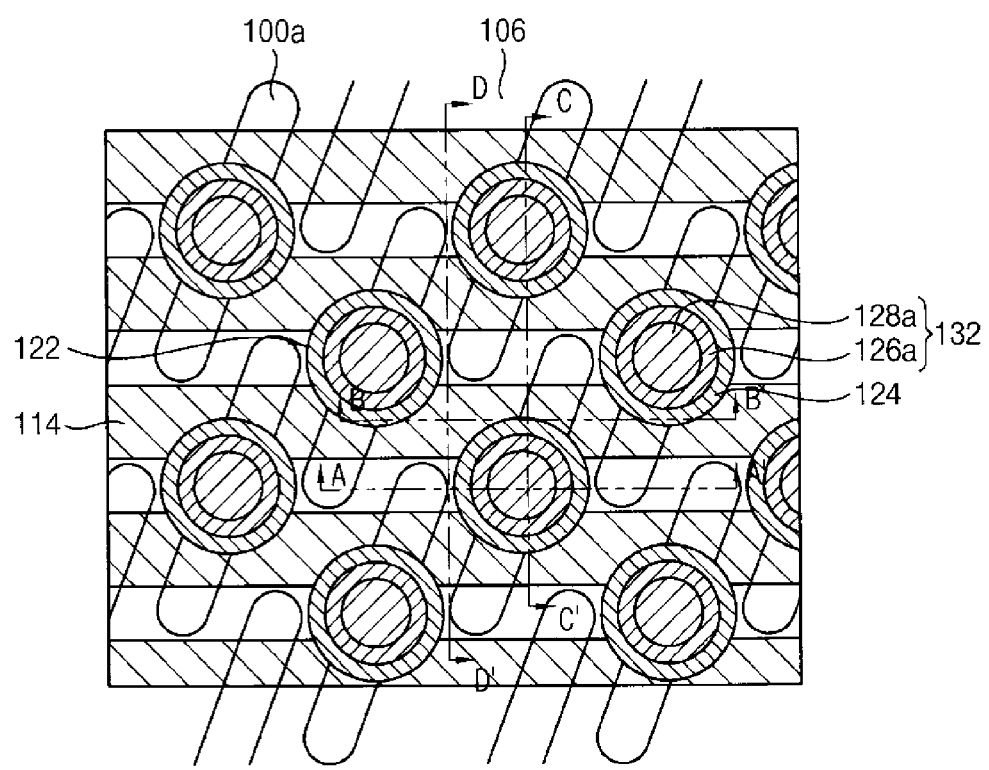

FIGS. 9 to 19 are cross-sectional views for explaining a method of manufacturing a semiconductor device illustrated in FIG. 7. FIGS. 20 to 22 are plan views corresponding to each of the cross-sectional views.

The cross-sectional views in FIGS. 9 to 19 may be obtained by cutting along lines A-A', B-B', C-C' and D-D', and the core/peripheral region.

Figure 9:
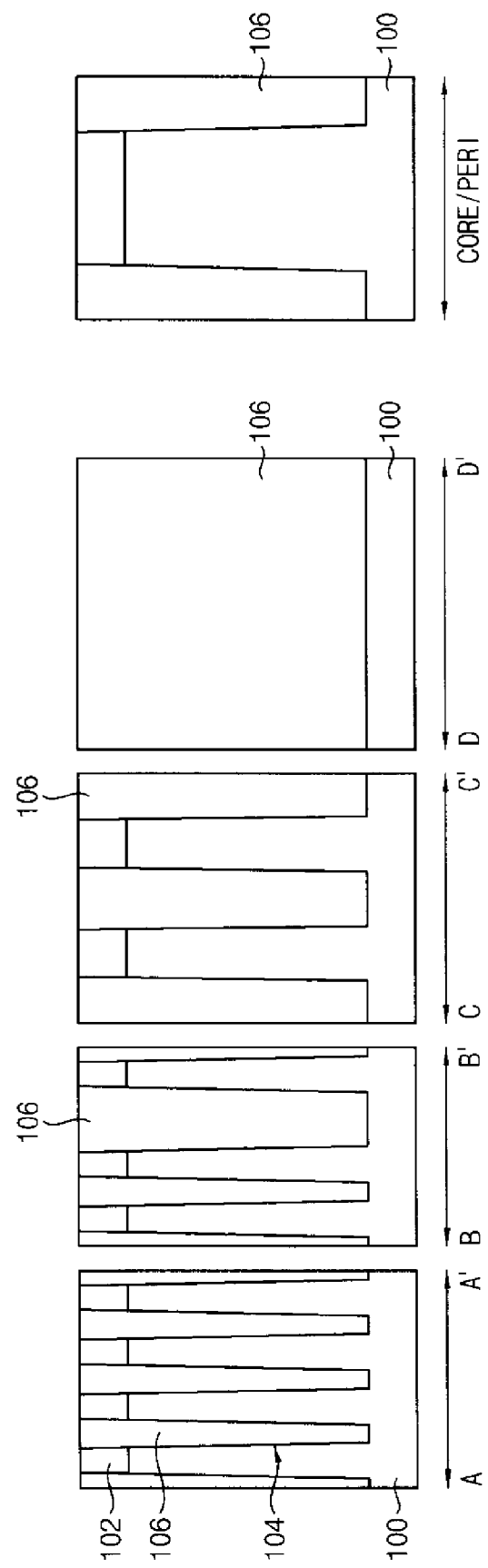

Referring to FIGS. 9 and 20, a substrate 100 including a semiconductor material and divided into a cell region and a core/peripheral region may be provided. In order to form a trench for device isolation 104 on the substrate 100, a first hard mask pattern 102 may be formed. The first hard mask pattern 102 may include silicon oxide or silicon nitride. The substrate 100 may be anisotropically etched by using the first hard mask pattern 102 as an etching mask to form the trench for device isolation 104. The substrate 100 at the portion excluding the trench for device isolation 104 may have a relatively extruding shape. Thus, the surface of the substrate 100 at the extruding portion may be provided as an active region 100a.

In the cell region, the active region 100a may have an isolated island shape having the longitudinal direction as the first direction. In addition, the active regions 100a may be arranged in parallel in the first direction. The first direction may not be perpendicular to the second direction which is the extended direction of a buried gate structure. In addition, the first direction may not be perpendicular to the third direction which is the extended direction of the bit line. That is, the first direction may be diagonal to the second direction and the third direction.

The active region 100a may include a first contact forming region at the upper surface of the center portion thereof and second and third contact forming regions at the upper surfaces of both edge portions thereof, respectively. The first contact forming region may become a region for making an electric connection with a bit line structure, and the second and third contact forming regions may become regions for making an electric connection with a capacitor.

An insulating layer for device isolation may be formed to fill up the inner portion of the trench for device isolation 104. The insulating layer for device isolation may include silicon oxide. Then, the insulating layer for device isolation may be planarized to form a device isolating layer pattern 106.

Even though not illustrated, impurities may be doped into the substrate 100 to form impurity regions under the surface of the substrate. The impurity regions may be provided as source and drain regions of a buried transistor.

Figure 10:
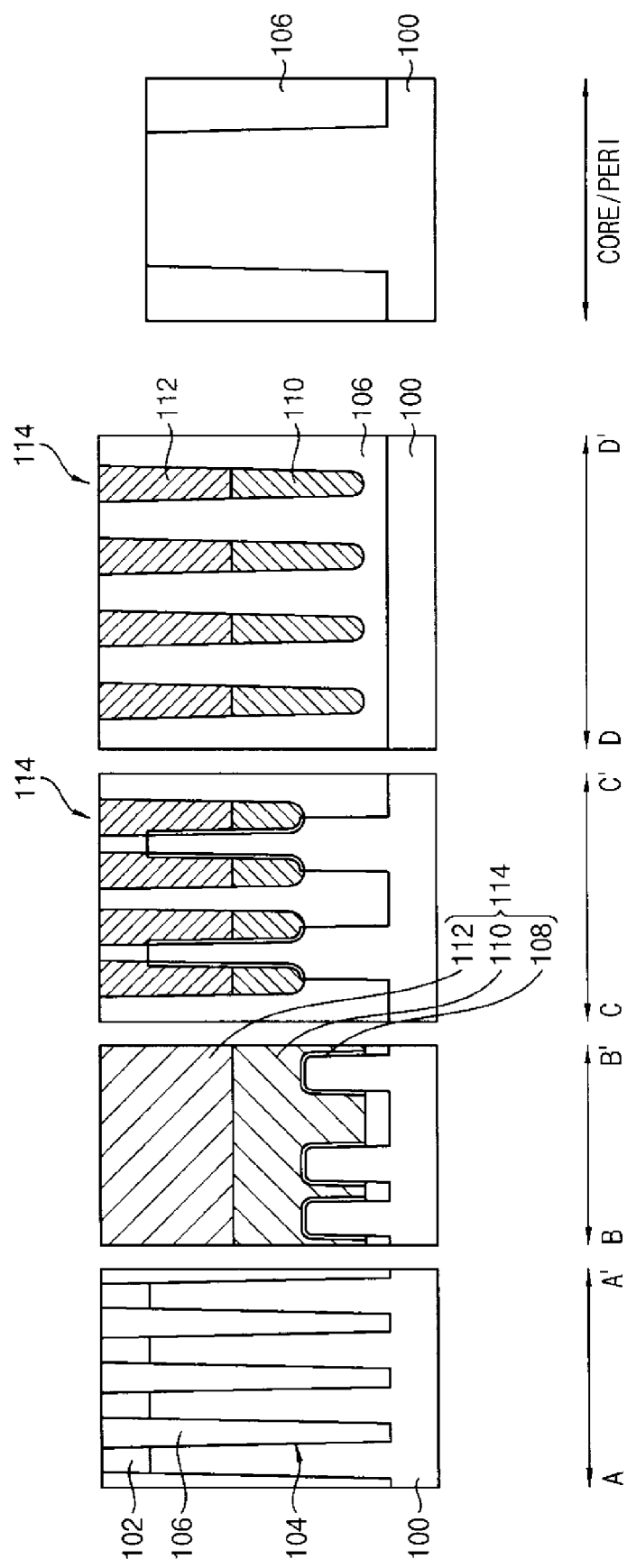

Referring to FIGS. 10 and 21, a portion of the first hard mask pattern 102, the substrate 100 and the device isolating layer pattern 106 may be etched to form trenches for gate extended in the second direction and having a line shape. The trenches for gate may be formed in the cell region of the substrate. In one isolated active region 100a, two trenches for gate may be disposed in parallel with a distance. In addition, the trench for gate may be disposed by ones with a distance from both of the edge portions of the isolated active region.

Along the side wall and the bottom surface of the trench for gate, a first gate insulating layer 108 may be formed. The first gate insulating layer 108 may include silicon oxide. The first gate insulating layer 108 may be formed through a thermal oxidation process or a chemical vapor deposition process. A conductive layer (not illustrated) may be formed on the first gate insulating layer 108 so as to fill up the trench for gate. In an example embodiment, the conductive layer may be formed by depositing a barrier metal layer and a metal layer one by one. Examples of materials that may be used for the barrier metal layer may include titanium, titanium nitride, tantalum, tantalum nitride, etc. These materials may be used alone or may be stacked by two or more. An example of the material that may be used as the metal layer may include tungsten. The conductive layer may be planarized through a chemical mechanical polishing process. Then, an etch back process may be conducted to form a buried gate electrode 110 filling up a portion of the trench for gate. An insulating layer for mask may be formed on the buried gate electrode 110 while filling up the inner portion of the trench for gate. Then, the insulating layer may be planarized to form an insulating layer pattern 112. The insulating layer pattern 112 may include a silicon nitride layer.

By conducting the above-described processes, a buried gate structure 114 extended in the second direction while having a line shape may be formed on the device isolating layer pattern 106 and on the substrate of the active region 100a. In the active region, the upper surface of the insulating layer pattern 112 may be exposed at the portion including the buried gate structure.

Even though not illustrated, after forming the buried gate structure, the first hard mask pattern may be removed and a pad layer may be formed at the removed portion of the first hard mask pattern. Particularly, the pad layer may include polysilicon. The polysilicon may be provided as an insulating material. Alternatively, the pad layer may include an insulating material such as silicon oxide. In order to simplify the process, the pad layer may be omitted.

Then, the first hard mask pattern 102 covering the substrate in the core/peripheral region may be selectively removed to expose the surface of the substrate 100 in the core/peripheral region.

Figure 11:
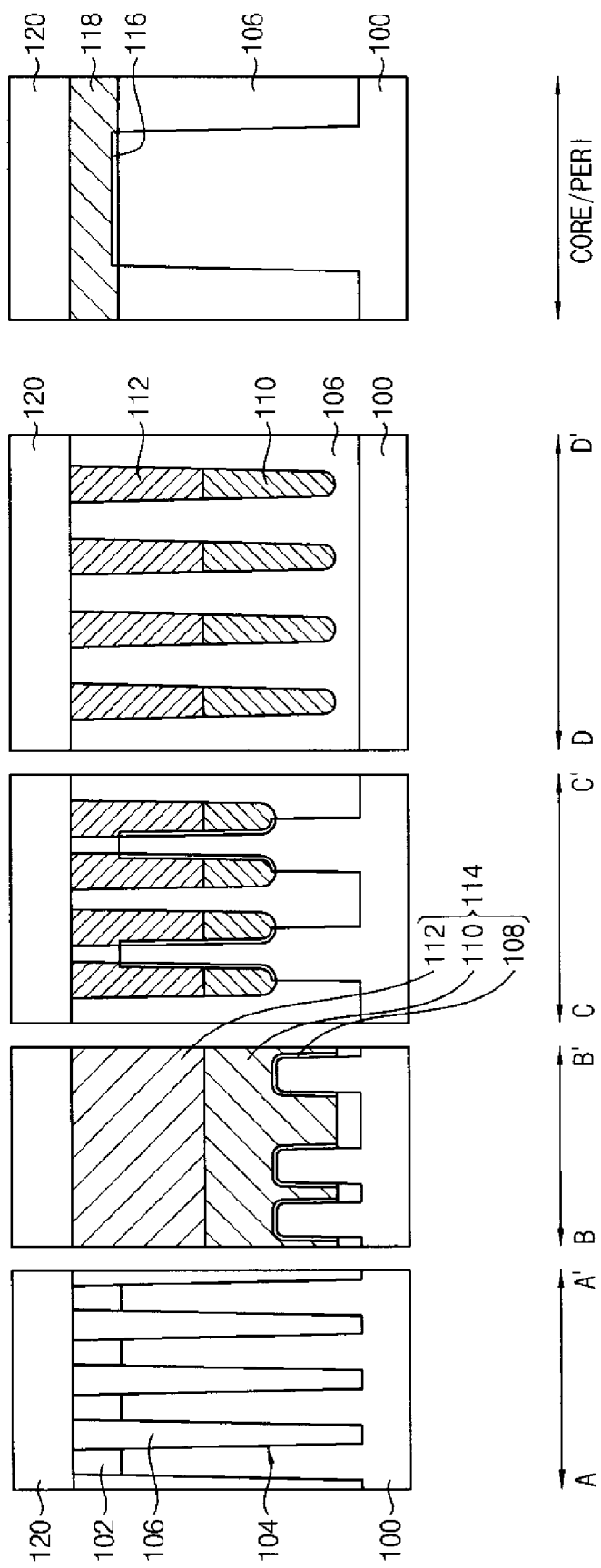

Referring to FIG. 11, a second gate insulating layer 116 may be formed at the surface of the substrate 100 in the core/peripheral region. The second gate insulating layer 116 may include silicon oxide. The second gate insulating layer 116 may be formed through a thermal oxidation process. Alternatively, the second gate insulating layer 116 may be formed through a chemical vapor deposition process or an atomic layer deposition process.

On the second gate insulating layer 116, a lower gate electrode layer 118 may be formed. The lower gate electrode layer 118 may include a polysilicon material. Then, the lower gate electrode layer 118 formed in the cell region may be removed while remaining the lower gate electrode layer 118 formed in the core/peripheral region.

A first insulating interlayer 120 may be formed on the substrate 100 including the buried gate structure in the cell region and on the lower gate electrode layer 118. The first insulating interlayer 120 may include silicon oxide.

Figure 12:
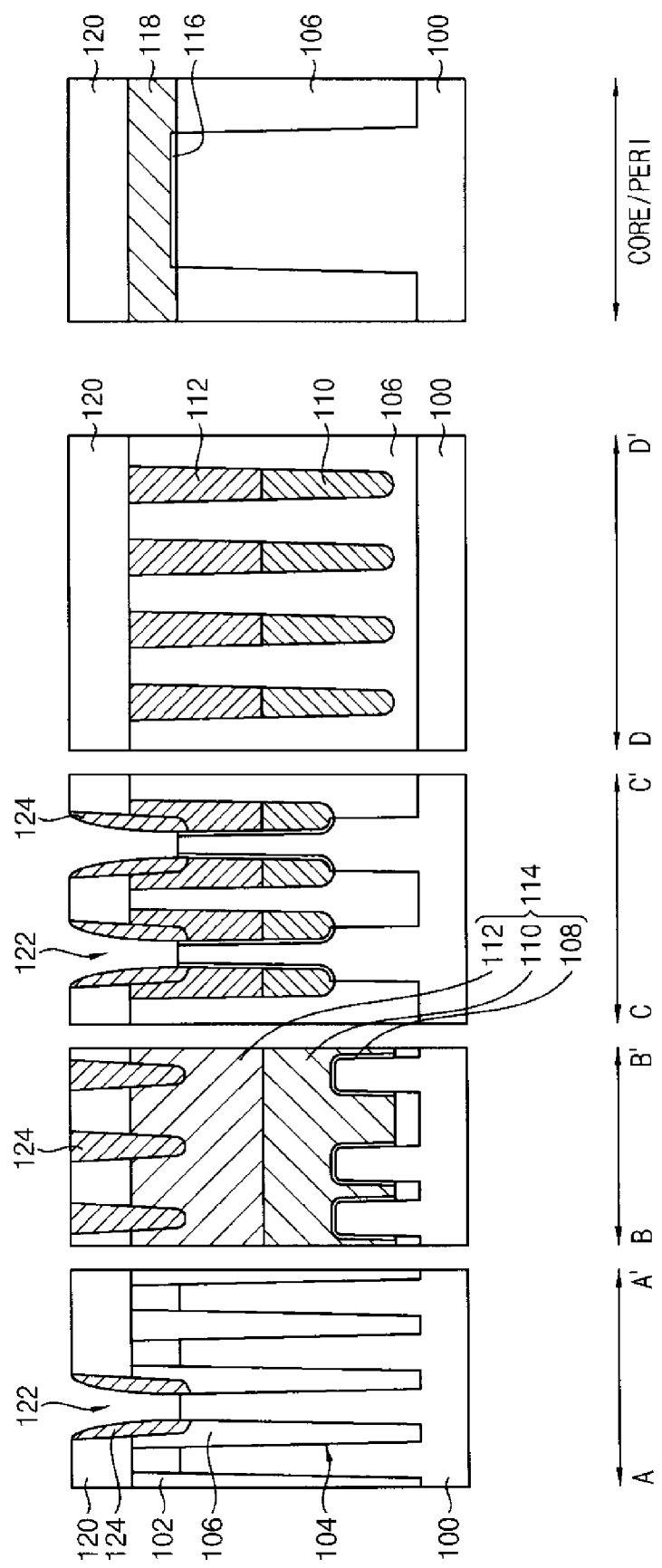

Referring to FIG. 12, a photoresist layer may be coated on the first insulating interlayer 120. The photoresist layer may be patterned by a photo process to form a first photoresist pattern (not illustrated). The first photoresist pattern may have a shape exposing the upper portion of the first contact forming region.

The first insulating interlayer 120 and the first hard mask pattern 122 may be etched by using the first photoresist pattern as an etching mask to form first contact holes 122. Through the first contact hole 122, the surface of the substrate 100 in the first contact forming region may be exposed. Then, the first photoresist pattern may be removed through performing an ashing process and a stripping process.

On the inner wall and the bottom surface of the first contact hole 122 and on the first insulating interlayer 120, an insulating layer for spacer (not illustrated) may be formed. The insulating layer for spacer may include silicon nitride. The insulating layer for spacer may be etched by an anisotropic etching process to form an inner spacer 124 on the inner wall of the first contact hole 122. During the anisotropic etching process, the entire insulating layer for spacer formed at the bottom portion of the first contact hole 122 may be removed. That is, the inner spacer 124 may be formed only on the inner wall of the first contact hole 122 to insulate the side wall portion of the first contact hole.

Figure 13:
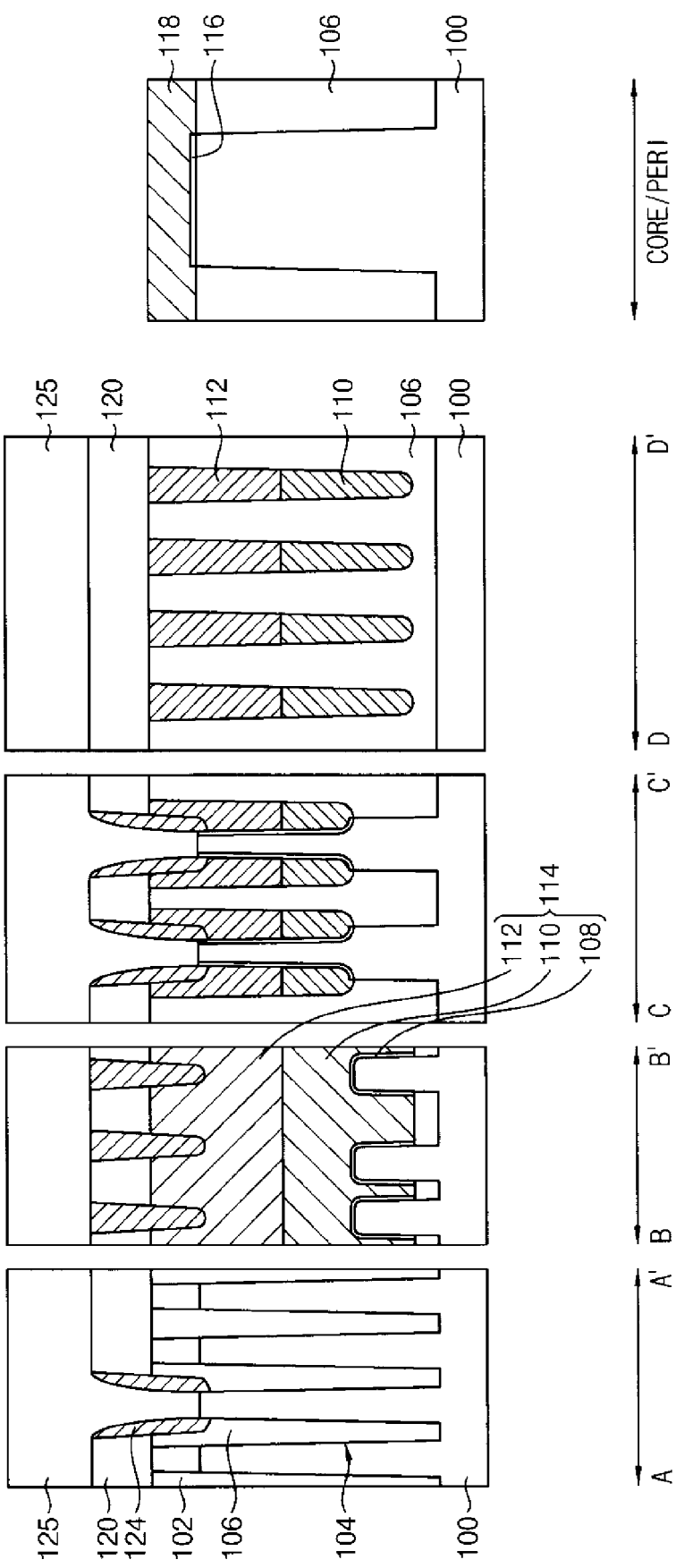

Referring to FIG. 13, a photoresist layer may be coated on the first insulating interlayer 120. The photoresist layer may fill up the inner portion of the first contact hole 122 while covering the first insulating interlayer 120. The photoresist layer may be patterned through a photo process to form a second photoresist pattern 125. The second photoresist pattern 125 may expose the entire core/peripheral region of the substrate and may cover the entire cell region.

The first insulating interlayer 120 may be etched by using the second photoresist pattern 125 as an etching mask. Through conducting the etching process, the first insulating interlayer 120 formed in the core/peripheral region may be selectively etched. Therefore, the upper surface of the lower gate electrode layer 118 formed in the core/peripheral region may be exposed. According to the etching of the first insulating interlayer 120 in the core/peripheral region, the height of the thin films formed in the core/peripheral region may be lower than the upper surface of the thin films formed in the cell region. On the contrary, the first insulating interlayer 120 in the cell region may not be etched, however, may maintain the same structure as obtained in a previous process. Then, the second photoresist pattern may be removed through performing an ashing process and a stripping process.

Figure 14:
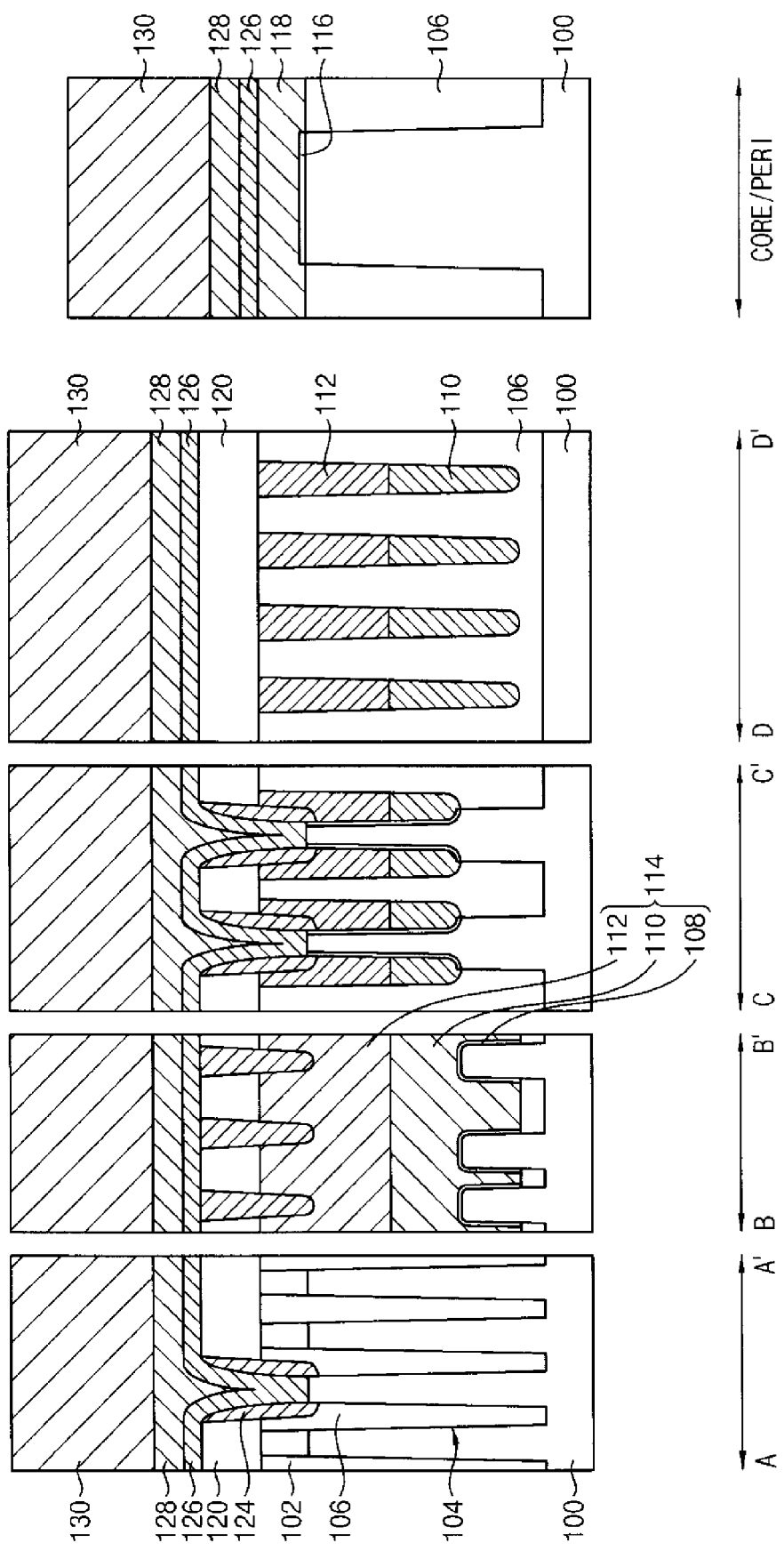

Referring to FIG. 14, a barrier metal layer 126 may be formed on the surface of the first insulating interlayer 120, the inner spacer 124, the first contact holes 122 and the lower gate electrode 118 in the core/peripheral region. As illustrated in the drawing, the barrier metal layer 126 may be formed along the surface profile of the inner portion of the first contact holes 122 while partially filling up an inner portion of the first contact holes 122.

The barrier metal layer 126 may have a shape directly contacting the surface of the substrate 100 in the first contact forming region exposed in the first contact hole 122. Because the surface of the substrate 100 including semiconductor materials and the barrier metal layer make a direct contact, an ohmic contact may be formed. When the surface of the substrate 100 and the metal make a direct contact without the barrier metal layer 126, a schottky contact may be formed, and this portion may undesirably operate as a diode. Thus, the barrier metal layer directly contacting the surface of the substrate 100 of the first contact forming region in the first contact hole 122 may be necessary.

Examples of materials that may be used for the barrier metal layer 126 may include titanium, titanium nitride, tantalum, tantalum nitride, etc. These materials may be used alone or may be stacked by two or more. Particularly, the barrier metal layer 126 may have a stacked structure of a titanium layer and a titanium nitride layer.

On the barrier metal layer 126, a first metal layer 128 may be formed. Examples of metal materials that may be used for the first metal layer may include tungsten, aluminum, copper, etc. These materials may be preferably used alone, however, may have a stacked structure of two or more. Particularly, the first metal layer 128 may include tungsten. The first metal layer 128 may be formed to a thickness for sufficiently filling up the inner portion of the first contact hole 122. In a subsequent process, among the first metal layer 128 formed in the cell region, the entire first metal layer except for the first metal layer 128 formed in the first contact hole may be removed. Thus, the first metal layer 128 may be preferably formed to a thickness of filling up the inner portion of the first contact hole 122.

On the first metal layer 128, a second hard mask layer 130 may be formed. The second hard mask layer 130 may include silicon nitride. The second hard mask layer 130 may be used as a passivation layer for passivating the first metal layer 128 formed in the core/peripheral region.

Figure 15:
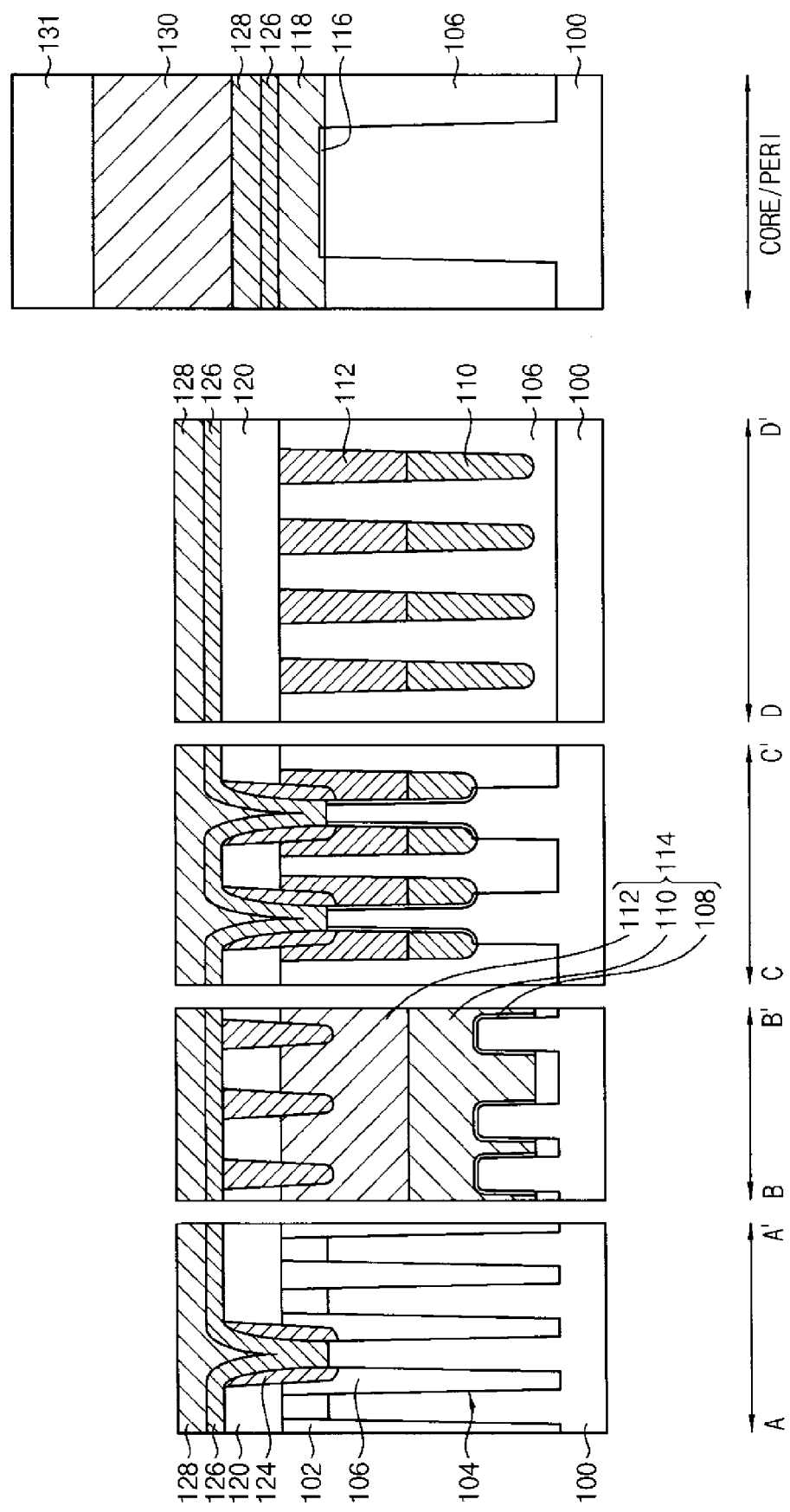

Referring to FIG. 15, a photoresist layer may be coated on the second hard mask layer 130. The photoresist layer may be patterned through a photo process to form a third photoresist pattern 131. The third photoresist pattern 131 may have a shape covering the entire core/peripheral region of the substrate 100 while exposing the entire cell region The second hard mask layer 130 may be etched by using the third photoresist pattern 131 as an etching mask. Through conducting the etching process, the second hard mask layer formed in the cell region may be removed. Thus, the upper surface portion of the first metal layer 128 may be exposed in the cell region. On the contrary, the second hard mask layer 130 formed in the core/peripheral region may remain as it is. Then, the third photoresist pattern 131 may be removed through conducting an ashing process and a stripping process.

Figure 16:
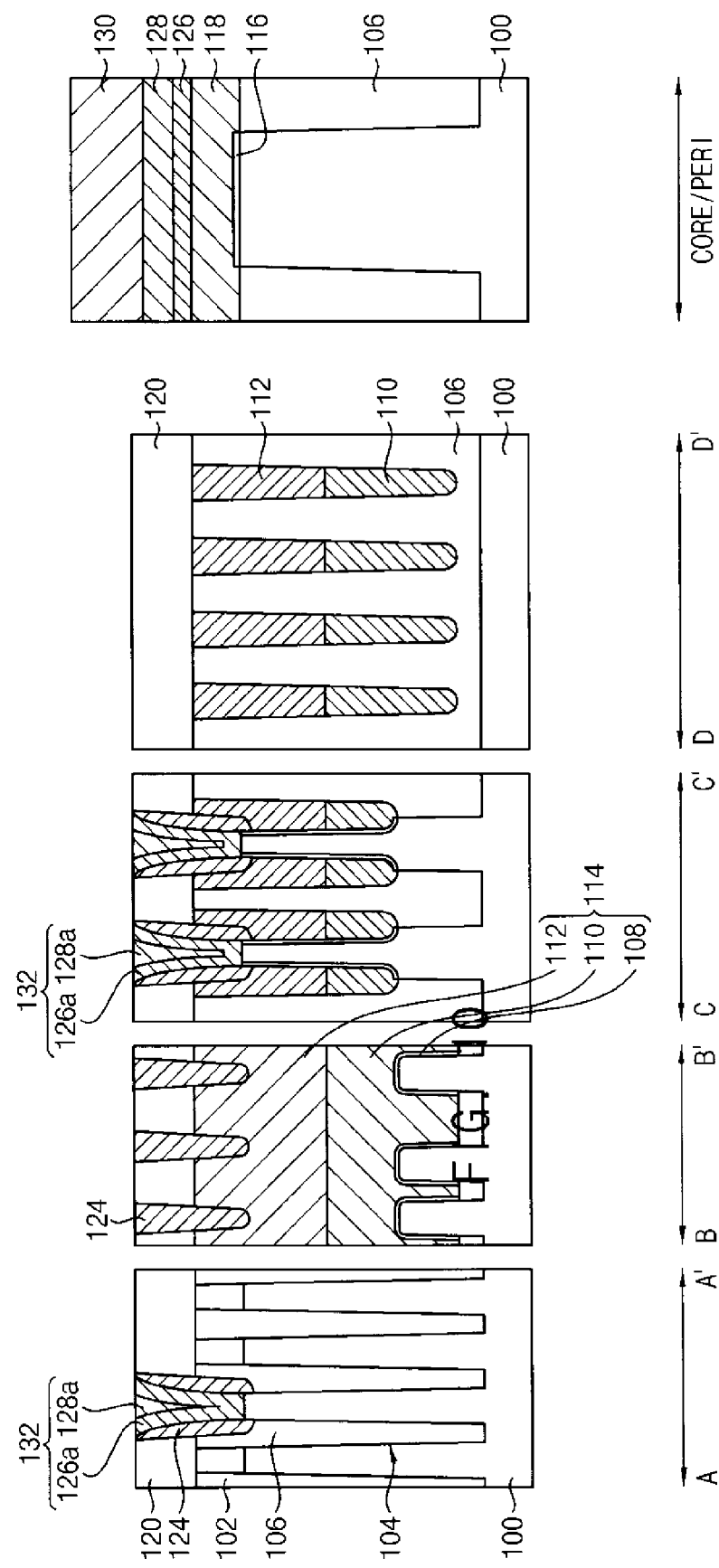

Referring to FIGS. 16 and 22, the first metal layer 128 and the barrier metal layer 126 formed on the first insulating interlayer 120 in the cell region may be removed. The removing process may be performed through a chemical mechanical polishing process.

Through the chemical mechanical polishing process, the first metal layer 128 and the barrier metal layer 126 may remain in the first contact hole 122 positioned in the cell region. Thus, a contact plug of a stacked structure of the first barrier metal layer pattern 126a and the first metal layer pattern 128a may be formed in the first contact hole 122. The contact plug may be provided as a bit line contact 132. In addition, the upper surface of the first insulating interlayer 120 may be exposed.

Meanwhile, the upper portion of the second hard mask layer 130 positioned in the core/peripheral region may be removed by a certain thickness by the chemical mechanical polishing process. After completing the chemical mechanical polishing process, the second hard mask layer 130 in the core/peripheral region may remain with a sufficient thickness to passivate the underlying first metal layer 128. Therefore, the first metal layer 128 in the core/peripheral region after conducting the chemical mechanical polishing process may remain by the same thickness as the thickness after deposition.

Figure 17:
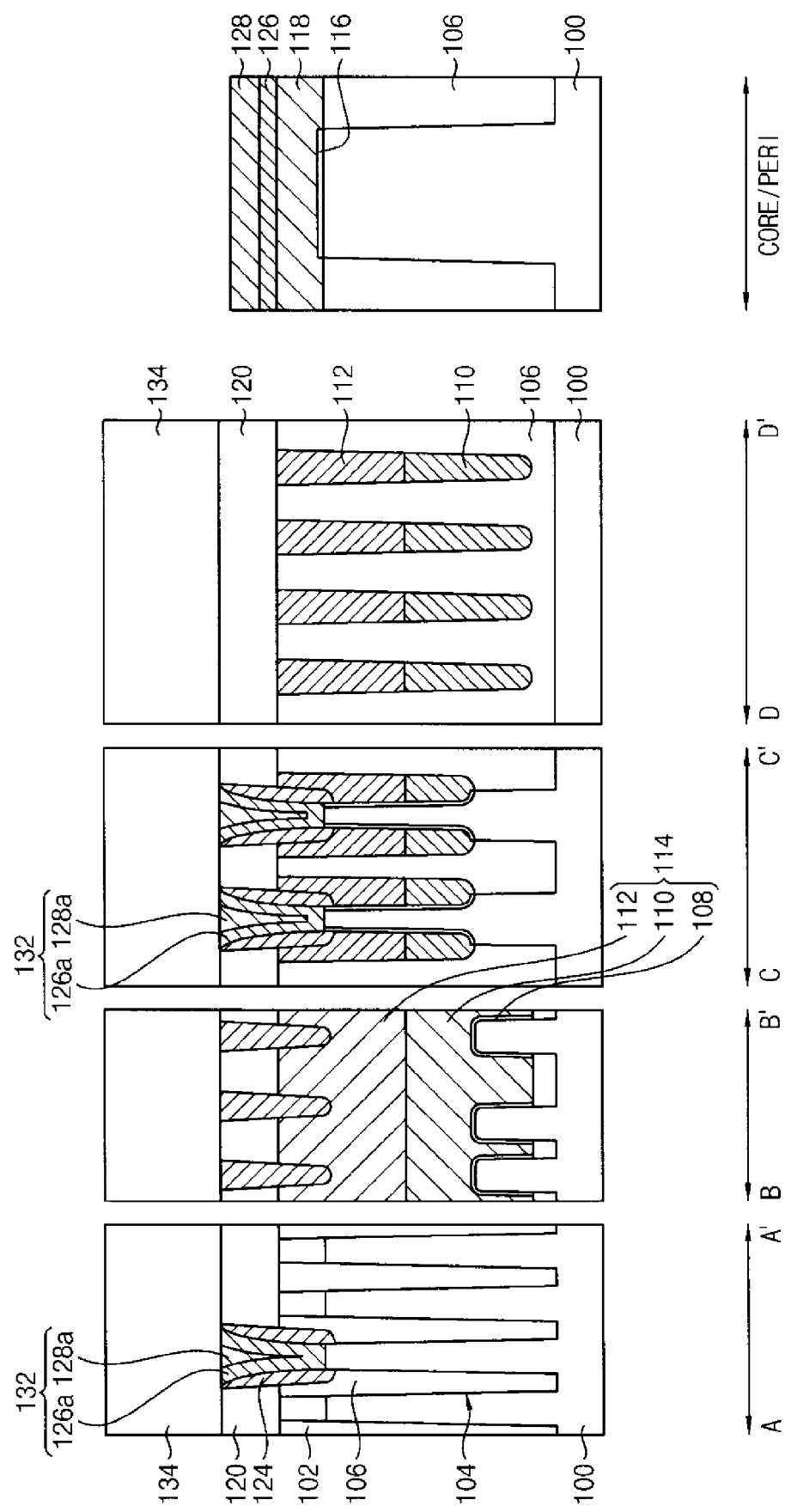

Referring to FIG. 17, a photoresist layer may be coated on the bit line contact 132, and the first insulating interlayer 120 in the cell region and the second hard mask layer 130 in the core/peripheral region. The photoresist layer may be patterned through a photo process to form a fourth photoresist pattern 134. The fourth photoresist pattern 134 may cover the entire cell region of the substrate while exposing the entire core/peripheral region.

The second hard mask layer 130 may be etched by using the fourth photoresist pattern 134 as an etching mask. Through performing the etching process, the entire second hard mask layer 130 in the core/peripheral region may be removed. Thus, the upper surface of the first metal layer 128 in the core/peripheral region may be exposed.

Figure 18:
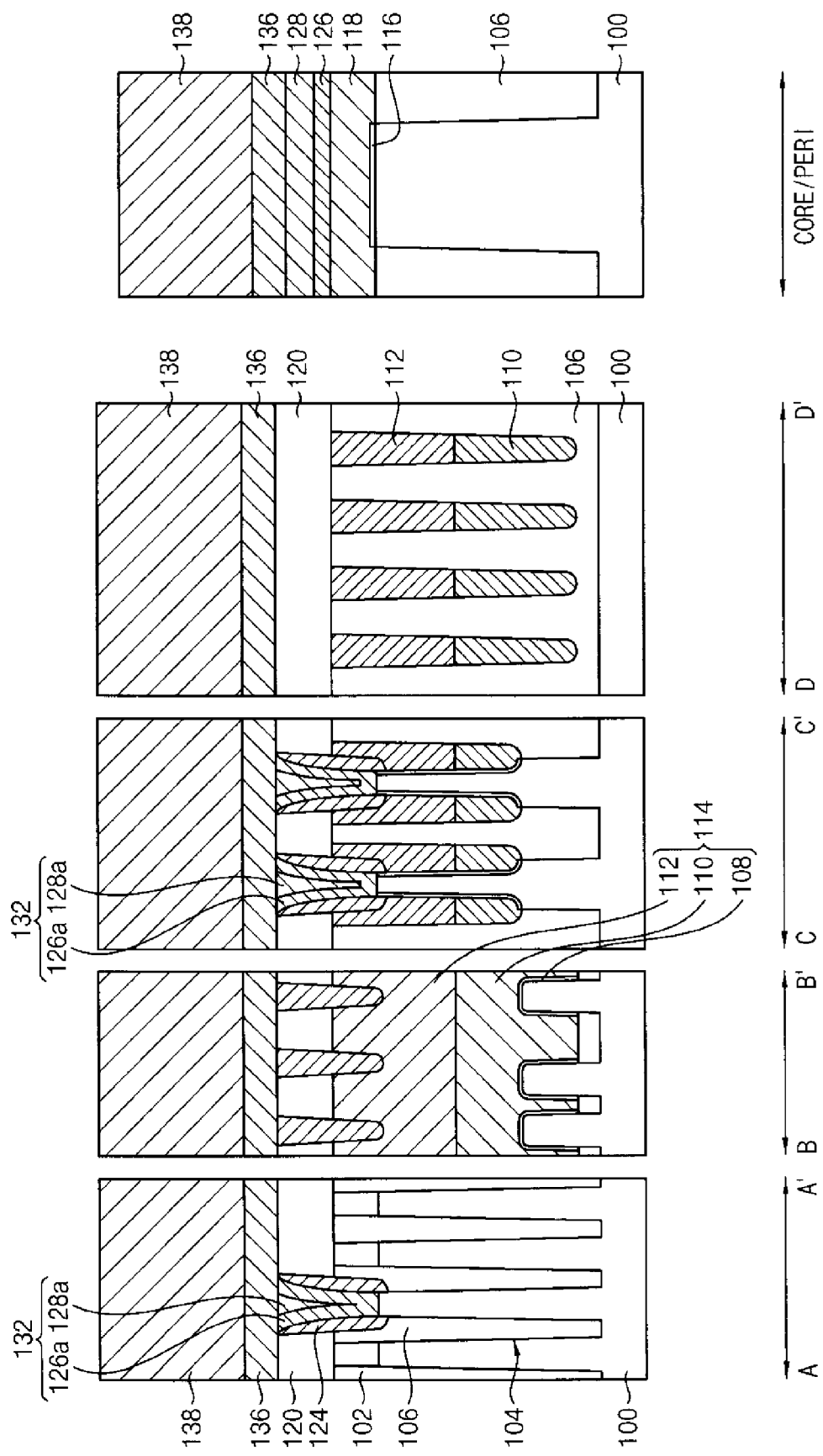

Referring to FIG. 18, a second metal layer 136 may be formed on the bit line contact 132 and the first insulating interlayer 120 in the cell region and the first metal layer 128 in the core/peripheral region. Because the first insulating interlayer 120 is not formed in the core/peripheral region, the structure formed in the core/peripheral region may have a smaller step than the structure formed in the cell region. Therefore, the upper surface of the second metal layer 136 formed in the core/peripheral region may be lower than the upper surface of the second metal layer 136 formed in the cell region.

Examples of metal materials that may be used for the second metal layer 136 may include tungsten, aluminum, copper, etc. These materials may be preferably used alone or may be stacked by two or more. Particularly, the second metal layer 136 may include tungsten. In order to obtain good adhesion properties of the first and second metal layers 128 and 136, the second metal layer 136 may include the same metal material as the first metal layer 128. Alternatively, the second metal layer 136 may include a different metal material from the first metal layer 128.

As illustrated in the drawing, the second metal layer 136 may directly contact the upper surface of the first insulating interlayer 120 and the first metal layer 128*a* in the cell region. In addition, the second metal layer 136 may directly contact the upper surface of the first metal layer 128 in the core/peripheral region. As described above, a barrier metal layer may not be formed between the first insulating interlayer 120 and the second metal layer 136. In addition, the barrier metal layer may not be formed between the first metal layer pattern 128*a* and the second metal layer 136.

That is, the barrier metal layer may not be additionally formed under the second metal layer 136 formed on the bit line contact 132. Thus, the height of the entire wiring structure may be decreased by the thickness of the barrier metal layer if formed. In this example embodiment, because only the second metal layer 136 may be included as the wiring structure directly contacting the upper surface of the bit line contact 132, a wiring structure having a quite small height may be formed when compared with a common wiring structure including a stacked structure of a barrier metal layer and a metal layer.

On the contrary, a stacked structure of the first and second metal layers 128 and 136 one by one may be formed in the core/peripheral region. That is, in the core/peripheral region, the layer for gate electrode may have a stacked structure of a lower gate electrode layer 118, a barrier metal layer 126, and first and second metal layers 128 and 136 one by one.

In succession, a third hard mask layer 138 may be formed on the second metal layer 136. The third hard mask layer 138 may include silicon nitride.

Figure 19:
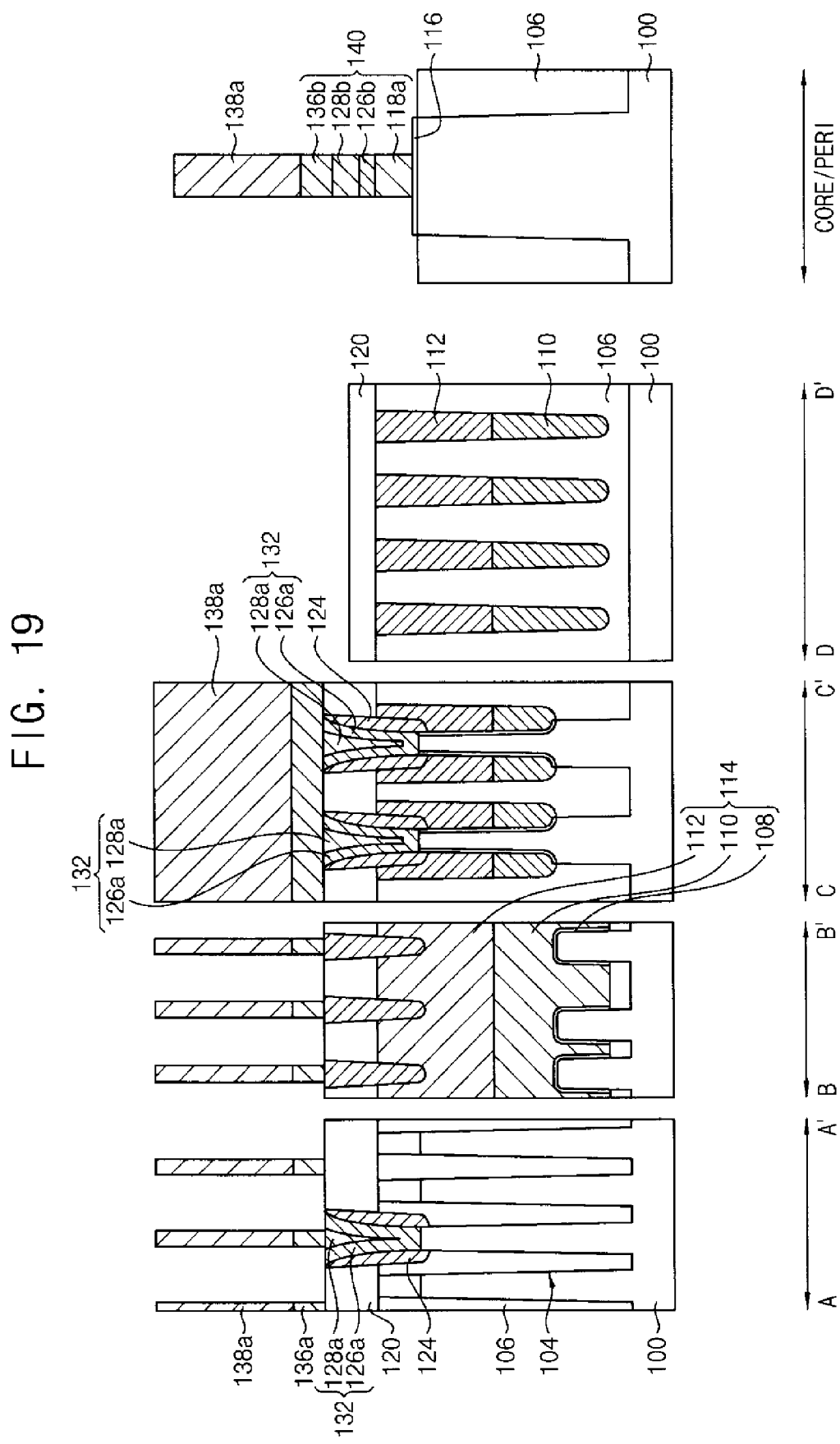

Referring to FIGS. 19 and 6, the third hard mask layer 138 may be patterned to form a third hard mask pattern 138*a*.

The third hard mask pattern 138*a* in the cell region may be used as a mask for forming a bit line. Thus, the third hard mask pattern 138*a* in the cell region may have a line shape extended in the third direction.

The third hard mask pattern 138*a* in the core/peripheral region may be used as a mask for forming a gate electrode structure for core/peripheral. Thus, the third hard mask pattern 138*a* may be formed to have the same shape as the gate electrode structure to be formed.

The second metal layer 136 may be etched by using the third hard mask pattern 138*a* as an etching mask. Through etching the second metal layer, a second metal layer pattern may be formed in the cell region. The second metal layer pattern may be provided as a bit line 136*a*.

In succession, the first metal layer 128, the barrier metal layer 126 and the lower gate electrode layer 118 formed in the core/peripheral region may be etched. Therefore, a gate electrode structure 140 including a lower gate pattern 118*a*, a second barrier metal layer pattern 126*b*, a third metal layer pattern 128*b* and a fourth metal layer pattern 136*b* stacked one by one may be formed in the core/peripheral region.

In this example embodiment, a bit line structure may include a bit line contact 132, a bit line 136*a* and a hard mask pattern. In the bit line 136*a*, a barrier metal layer pattern may not be included. That is, a second metal layer pattern constituting the bit line 136*a* may directly contact the first insulating interlayer 120 without the barrier metal layer pattern. Thus, the adhesion properties of the second metal layer pattern and the first insulating interlayer 120 may not be good.

However, because a first barrier metal layer pattern 126*a* may be provided in the bit line contact 132, the adhesion properties between metals may be very good at a portion making a direct contact between the bit line contact 132 and the bit line 136*a*. Because each of the bit lines 136*a* may have an extended line shape while repeatedly contacting the bit line contact 132, the bit line 136*a* may make a strong adhesion at the contacting portion with the bit line contact 132. Even though the bit line 136*a* may be formed on the first insulating interlayer 120 without the barrier metal, defects such as metal lifting may be hardly generated.

To decrease the generation of the metal lifting, the area of the bottom portion of one bit line 136*a* directly contacting the bit line contact 132 may be preferably about 30% or over with respect to the total area at the bottom portion of one bit line 136*a*. In an example embodiment, the area of the bottom portion of one bit line 136*a* directly contacting the bit line contact 132 may be about 30% to about 70% with respect to the total area at the bottom portion of one bit line 136*a*. Particularly, in highly integrated semiconductor devices, because the horizontal area of a contacting region of the bit line contact 132 and one bit line 136*a* is relatively increased recently, the adhesion properties at the contacting portion with the bit line contact 132 may function more strongly. Thus, the metal lifting included in the bit line 136*a* may be hardly generated.

As illustrated in the drawing, because the barrier metal layer pattern may not be included in the bit line 136*a*, the height of the bit line 136*a* may be decreased by the thickness of the barrier metal layer pattern to be formed. That is, the bit line 136*a* in accordance with this example embodiment may have a quite small height when compared with a bit line having a common stacked structure of a barrier metal layer pattern and a metal layer pattern one by one. Particularly, when the barrier metal layer pattern has a height of about 30% of the total bit line having a common structure including the barrier metal layer pattern, a bit line 136*a* having a smaller height decreased by about 30% of the height of the bit line having the common structure may be formed in accordance with this example embodiment.

In a highly integrated device, because the gap between the bit lines 136*a* is very small, parasitic capacitance between the bit lines 136a may be generated, and so, a signal response time of the semiconductor device may be increased. However, in this example embodiment, because the height of the bit line 136a may be decreased, the parasitic capacitance between the bit lines 136a may be largely decreased. Thus, a semiconductor device having a rapid response time and high performance may be manufactured.

In addition, because the bit line 136a and the bit line contact 132 may make a contact without interposing a barrier metal layer pattern at the interface there between, the contact resistance between the bit line 136a and the bit line contact 132 may be decreased.

Meanwhile, after performing the etching process, a gate electrode structure 140 of a transistor may be formed in the core/peripheral region. The gate electrode structure 140 may have a stacked structure of a lower gate pattern 118a, a second barrier metal layer pattern 126b, a third metal layer pattern 128b, a fourth metal layer pattern 136b and a third hard mask pattern 138a one by one. The lower gate pattern 118a may include polysilicon. Likewise, through providing a second barrier metal layer pattern 126b between the lower gate pattern 126b including the polysilicon and the third metal layer pattern 128b, the polysilicon and the third metal layer pattern 128b may make an ohmic contact. In addition, the third and fourth metal layer patterns 128b and 136b may make a strong adhesion with underlying polysilicon.

The gate electrode structure 140 in the core/peripheral region may be formed while performing the process for forming a bit line contact 132 and a bit line 136a in a cell region. The gate electrode structure 140 may include a metal material included in the bit line contact 132 and the bit line 136a. That is, the second barrier metal layer pattern 126b may include the same material as the first barrier metal layer pattern 126a, the third metal layer pattern 128b may include the same material as the first metal layer pattern 128a, and the fourth metal layer pattern 136b may include the same material as the second metal layer pattern 136a. The fourth metal layer pattern 136b may have substantially the same height as the second metal layer pattern 136a.

The gate electrode structure 140 may have a stacked structure of the third and fourth metal layer patterns 128b and 136b. Thus, the metal material included in the gate electrode structure 140 may be thicker than the metal material included in the bit line 136a. As described above, the gate electrode structure 140 in the core/peripheral region may have a different thickness from the metal material included in the bit line in the cell region.

Referring to FIG. 7 again, insulating spacers 148 may be formed at both of the side walls of the bit line 136a and the third hard mask pattern 138a in the cell region. In addition, the insulating spacers 148 may also be formed at both of the side walls of the gate electrode structure 140 and the third hard mask pattern in the core/peripheral region.

A second insulating interlayer 150 filling up a gap between the bit lines while covering the gate electrode structures may be formed. After forming the second insulating interlayer 150, a planarization process may be further performed with respect to the third insulating interlayer 150 to expose the upper surface of the third hard mask pattern 138a.

A portion of the second insulating interlayer 150 may be etched and the first insulating interlayer 120 may be etched to form storage node contact holes exposing the surface of the substrate in the second and third contact forming regions. Even though not illustrated, the insulating spacers may be additionally formed at both of the side walls of the storage node contact hole. A conductive layer may be formed in the storage node contact holes, and the conductive layer may be polished to form storage node contacts 152. The conductive layer may include polysilicon. Alternatively, the conductive layer may include a metal material.

Then, a capacitor 154 may be formed on the upper surface of the storage node contact 152. The capacitor 154 may be formed as a cylinder type capacitor or a stack type capacitor. Through conducting the above described processes, a DRAM device may be completed.

Wiring Structure

Figure 23:
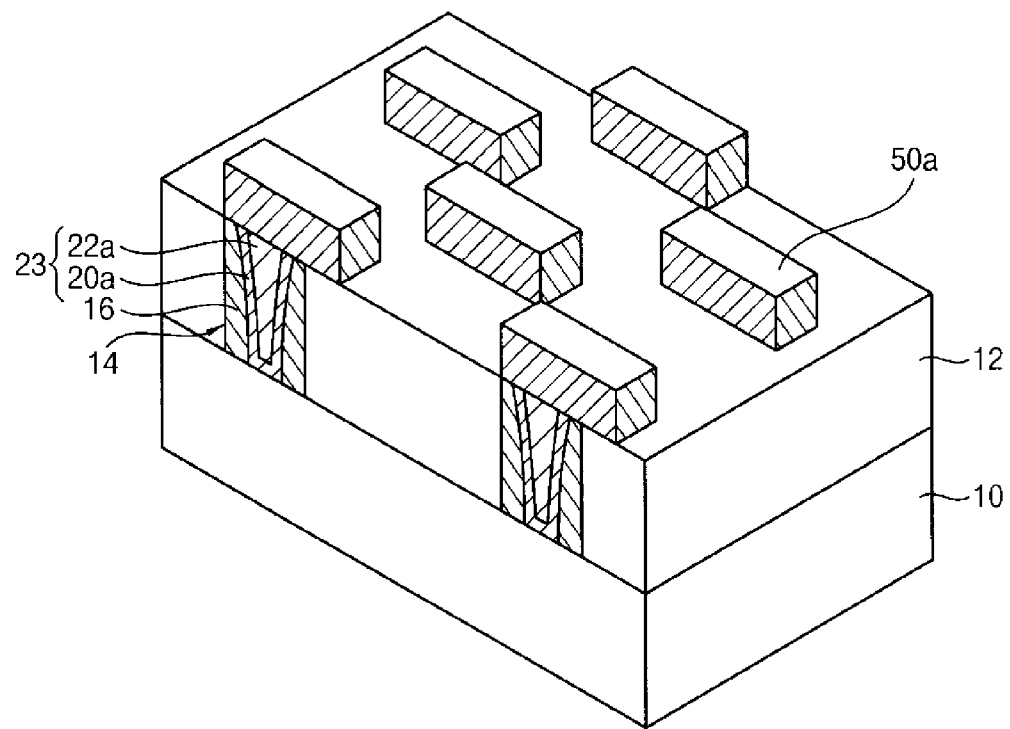

FIG. 23 is a perspective view illustrating a wiring structure of a semiconductor device in accordance with a yet further example embodiment.

The wiring structure described herein below may be the same as the wiring structure in the example embodiment shown in FIG. 1 except for the shape of a second metal layer pattern.

Referring to FIG. 23, a substrate 10 including a semiconductor material may be provided. On the substrate 10, devices such as transistors may be formed.

On the substrate 10, an insulating interlayer 12 may be provided. In the insulating interlayer 12, contact holes 14 exposing a portion of the surface of the substrate 10 may be included. On the inner wall of the contact hole 14, an inner spacer 16 including an insulating material may be provided. However, the inner spacer 16 may not be provided.

A contact plug 23 may be provided in each of the contact holes 14 including the inner spacer 16. The contact plug 23 may include a barrier metal layer pattern 20a and a first metal layer pattern 22a. The contact plug 23 may have the same constitution as described in the example embodiment shown in FIG. 1.

A second metal layer pattern 50a having an isolated island shape and contacting at least a portion of the upper surface of the first metal layer pattern 22a and the insulating interlayer 12 may be provided. The second metal layer pattern 50a may be provided as a pad pattern making an electric connection with the contact plug 23. Examples of metal materials that may be used for the second metal layer pattern 50a may include tungsten, aluminum, copper, etc. These materials may be preferably used alone or may be a stacked structure of two or more. Particularly, the second metal layer pattern 50a may include tungsten.

In order to obtain good adhesion properties of the first and second metal layer patterns 22a and 50a, the second metal layer pattern 50a may include the same metal material as the first metal layer pattern 22a. Alternatively, the second metal layer pattern 50a may include a different metal material from the first metal layer pattern 22a.

In order to obtain good adhesion properties of the second metal layer pattern 50a, the area of a of the bottom portion of one isolated second metal layer pattern 50a directly contacting the contact plugs 23 may be about 30% to about 70% with respect to the total area of the bottom portion of one isolated second metal layer pattern 50a.

As described above, a barrier metal layer may not be provided between the first and second metal layer patterns 22a and 50a, and between the second metal layer pattern 50a and the insulating interlayer 12. Thus, a process of forming the barrier metal layer may be omitted during forming the second metal layer pattern 50a, and the wiring structure may be easily manufactured.

Figure 24:
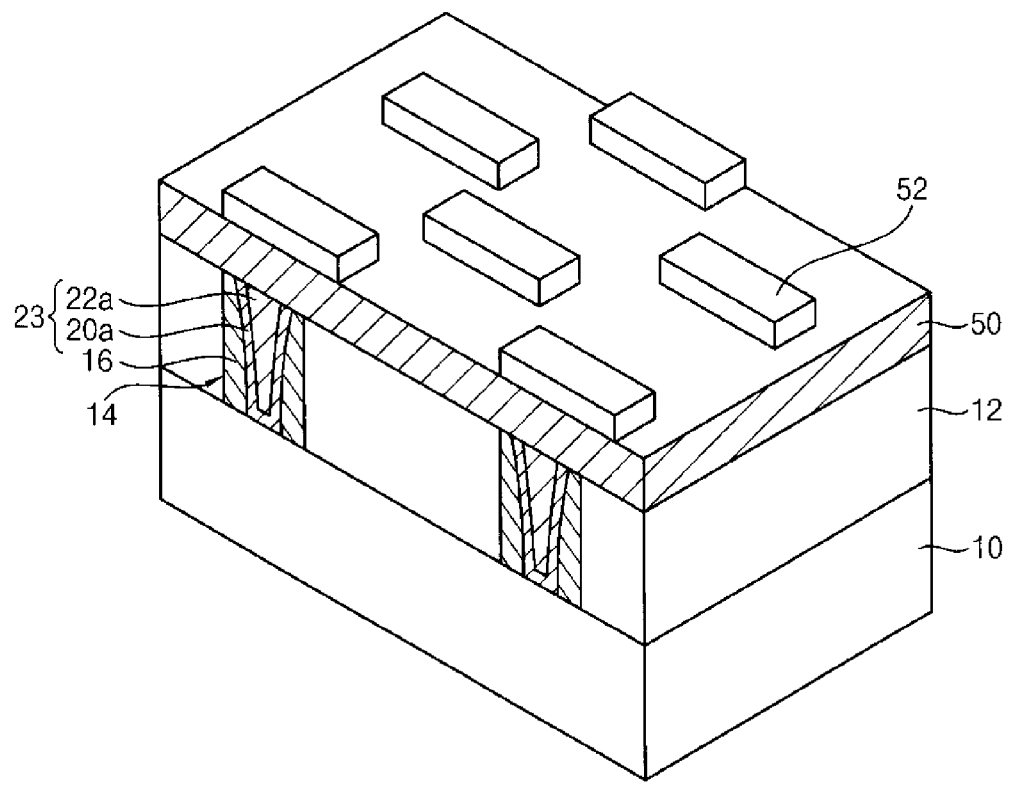

FIG. 24 is a perspective view for illustrating a method of manufacturing a wiring structure of a semiconductor device in FIG. 23.

First, the same procedure explained referring to FIGS. 2 to 4 may be conducted.

Referring to FIG. 24, a second metal layer 50 may be formed on the contact plugs 23 and the insulating interlayer 12. The second metal layer 50 may be the same as that described referring to FIG. 5.

An etching mask pattern 52 may be formed on the second metal layer 50. The etching mask pattern 52 may have an isolated island shape. The isolated etching mask pattern 52 may have a shape of covering at least a portion of the upper surface of the first metal layer pattern 22a and at least a portion of the insulating interlayer 12.

Referring to FIG. 23 again, the second metal layer 50 may be etched by using the etching mask pattern 52. Through the etching process, a second metal layer pattern 50a making a contact with the contact plug 23, extended to the upper portion of the insulating interlayer 12, and having an isolated island shape may be formed. In this case, the area of a region of the bottom portion of one isolated second metal layer pattern 50a directly contacting the contact plugs 23 may be about 30% to about 70% with respect to the total area of the bottom portion of one isolated second metal layer pattern 50a.

As described above, only the second metal layer 50 including a metal material may be etched through the etching process. Thus, the second metal layer pattern 50a having a pad shape contacting the contact plug may be formed without etching the barrier metal layer. Therefore, the resputtering of the metal in the etching process for forming the second metal layer pattern may be decreased. In addition, the wiring structure may be easily manufactured.

Hereinafter, semiconductor devices including a portion for forming a contact plug and a pad pattern are described.

Semiconductor Device

Figure 25:
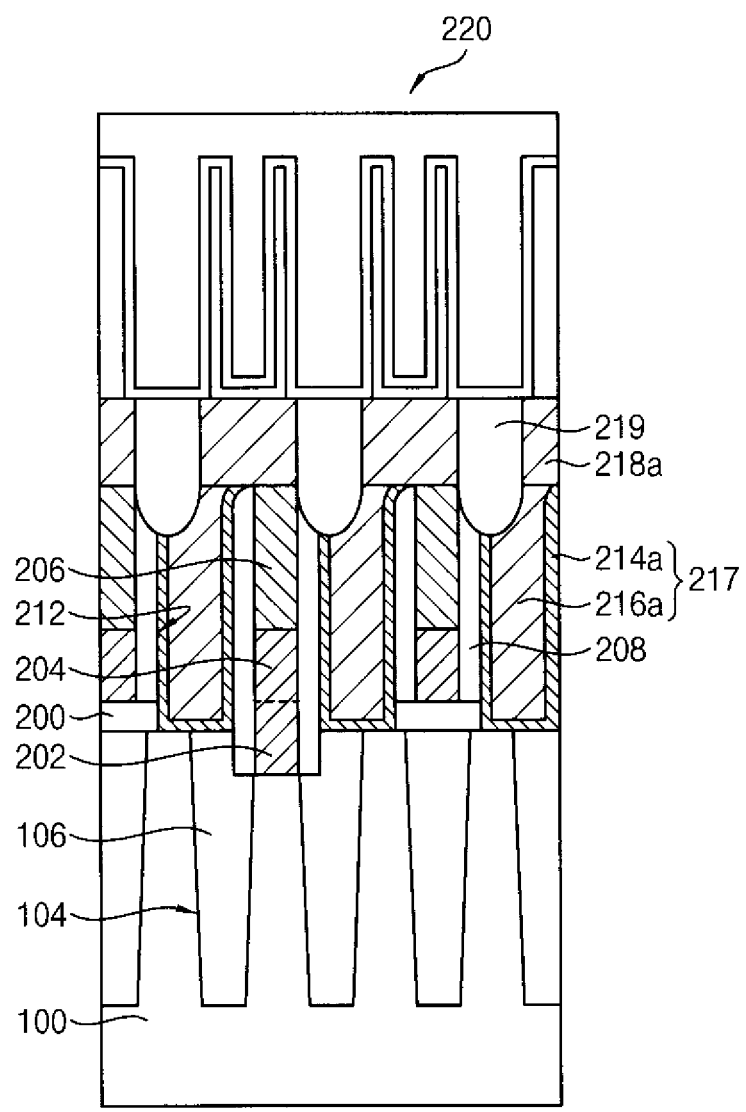

FIG. 25 is a cross-sectional view of a semiconductor device in accordance with still another example embodiment.

FIG. 25 illustrates only a portion of the cell of a DRAM cell.

Referring to FIG. 25, a substrate 100 including a semiconductor material may be provided. At the upper portion of the substrate 100, a trench for device isolation 104 may be formed. In addition, a device isolating layer pattern 106 may be formed in the trench for device isolation 104. Thus, the surface of the substrate 100 may be divided into an active region and a field region by the device isolating layer patterns 106.

At the upper portion of the substrate, trenches for gate may be provided, and in the trench for gate, a buried gate structure (not illustrated) having an extended line shape in the second direction may be provided.

A first insulating interlayer 200 may be provided on the substrate 100.

A bit line contact 202 making a contact with the upper surface of a portion of the active regions of the substrate 100 may be provided through the first insulating interlayer 200. A bit line 204 and a hard mask pattern 206 may be provided on the bit line contact 202 and the first insulating interlayer 200. The bit line 204 and the bit line contact 202 may include a barrier metal and a metal, respectively. The stacked structure and the arrangement of the barrier metal and the metal included in the bit line 204 and the bit line contact 202 may not be limited. The bit line 204 and the bit line contact 202 may have the same stacked structure and the arrangement of the barrier metal and the metal as those described in the example embodiment shown in FIG. 6. Alternatively, the bit line 204 and the bit line contact 202 may have different stacked structure and arrangement of the barrier metal and metal from those explained in the example embodiment shown in FIG. 6.

On both of the side walls of the bit line structure including the bit line 204, the bit line contact 202 and the hard mask pattern 206, insulating spacers 208 may be provided. A second insulating interlayer (not illustrated) filling up a gap between the bit line structures may be provided.

A storage node contact hole 212 penetrating through the first insulating interlayer 200 and the second insulating interlayer may be provided. The bottom surface of the storage node contact hole 212 may expose a portion of the active region of the substrate 100. The storage node contact hole 212 may be positioned between the bit line structures. In addition, on the inner side wall of the storage node contact hole 212, the insulating spacers 208 may be exposed.

A first barrier metal layer pattern 214a making a contact with a portion of the side wall and the bottom surface of the storage node contact hole 212 may be provided. The first barrier metal layer pattern 214a may be positioned only in the storage node contact hole 212. Examples of materials that may be used for the first barrier metal layer pattern 214a may include titanium, titanium nitride, tantalum, tantalum nitride, etc. These materials may be used alone or may be stacked by two or more. Particularly, the first barrier metal layer pattern 214a may have a stacked structure of a titanium layer and a titanium nitride layer.

A first metal layer pattern 216a may be provided on the first barrier metal layer pattern 214a. The first metal layer pattern 216a may be positioned only in the storage node contact hole 122. Examples of metal materials that may be used for the first metal layer pattern 216a may include tungsten, aluminum, copper, etc. These materials may be used alone or may be stacked by two or more. Particularly, the first metal layer pattern 216a may include tungsten.

The first barrier metal layer pattern 214a and the first metal layer pattern 216a may be provided as a storage node contact 217.

As illustrated in the drawing, the storage node contact 217 may be bilaterally asymmetric from the cross-sectional view when cutting along the second direction. That is, the storage node contact 217 may have a shape obtained by etching a portion of the barrier metal layer and the metal layer positioned at the upper portion of the storage node contact hole 212. Thus, the height of the first barrier metal layer pattern 214a may be changed according to the position of the inner wall of the storage node contact hole 212.

A pad pattern 218a contacting the upper surface of the first metal layer pattern 216a, extended to the upper surface of the second insulating interlayer (not illustrated) and the hard mask pattern 206, and having an isolated shape may be provided. The pad pattern 218a may include the same metal material as the first metal layer pattern 216a. Examples of metal materials that may be used for the pad pattern 218a may include tungsten, aluminum, copper, etc. These materials may be used alone or may be stacked by two or more. Particularly, the pad pattern 218a may include tungsten.

The pad pattern 218a may be provided as a pad contacting the upper surface of the storage node contact 217. Thus, the pad pattern 218a may have an isolated pattern shape contacting the upper surface of each of the storage node contact 217.

The pad pattern 218a may not include a barrier metal layer. In addition, the pad pattern 218a may have a shape directly contacting the first metal layer pattern 216a, a second insulating interlayer (not illustrated) and the hard mask pattern 206.

Generally, when the barrier metal layer is included at the bottom surface of the pad pattern 218a, bridge defects by which neighboring pad patterns may contact to each other, may be frequently generated caused by the barrier metal layer. In example embodiments, because the barrier metal layer may not be included in the pad pattern 218a, the bridge defects of contacting between the pad patterns 218a may be decreased.

A capacitor 220 making an electric connection with the upper surface of the pad pattern 218a may be provided. The capacitor 220 may be formed as a cylinder type capacitor or as a stack type capacitor.

FIGS. 26 to 29 are cross-sectional views for explaining a method of manufacturing a semiconductor device illustrated in FIG. 25.

Through performing a device isolation process, a device isolating layer pattern 106 may be formed on the upper portion of a semiconductor substrate 100. In the semiconductor substrate 100, buried gate structures (not illustrated) may be formed. On the substrate 100, a first insulating interlayer 200 may be formed. Through the first insulating interlayer 200, a bit line contact 202 contacting the upper surface of a portion of the active region of the substrate 100 may be formed. In addition, a bit line 204 contacting the bit line contact 202 and extended in the third direction and a hard mask pattern 206 may be formed.

The above-described processes may be the same as the processes described referring to FIGS. 9 to 19 in the example embodiment shown in FIG. 6. However, the above-described processes may not be limited to the processes described in the example embodiment shown in FIG. 6, and other known methods of manufacturing a DRAM device including a buried gate structure may also be applied.

Figure 26:
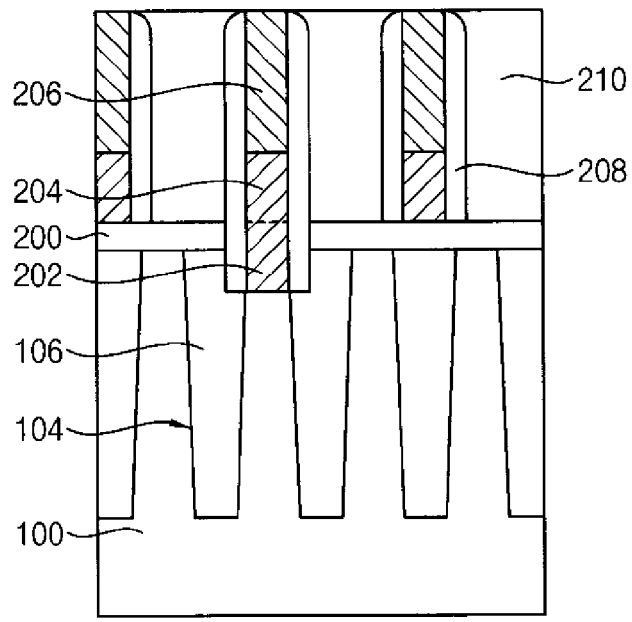

Referring to FIG. 26, insulating spacers 208 including the bit line contact 202, the bit line 204 and the hard mask pattern 206 may be formed at both side walls of the bit line structure. A second insulating interlayer 210 filling up a gap between the bit line structures may be formed.

Figure 27:
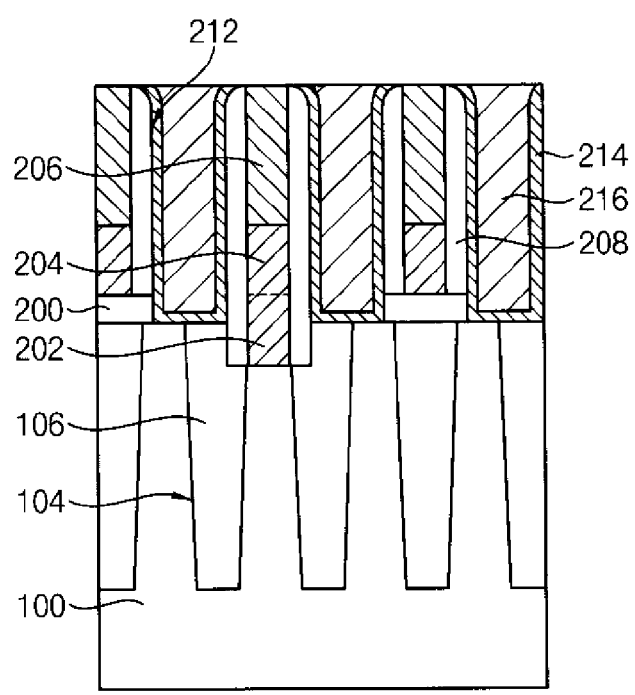

Referring to FIG. 27, a portion of the second and first insulating interlayers 210 and 200 may be etched to form a storage node contact hole 212 penetrating the second and first insulating interlayers 210 and 200. Through the bottom portion of the storage node contact hole 212, a portion of the active region of the substrate 100 may be exposed. The storage node contact hole 212 may be positioned between the bit line structures. An etching process for forming the storage node contact hole 212 may be performed by conditions which may hardly etch the insulating spacers 208. Thus, through the inner side wall of the storage node contact hole 221, the insulating spacers may be exposed.

Then, a barrier metal layer (not illustrated) may be formed on the surface of the storage node contact hole 212. A first metal layer (not illustrated) filling up the storage node contact hole 212 may be formed on the barrier metal layer.

Examples of materials that may be used for the barrier metal layer may include titanium, titanium nitride, tantalum, tantalum nitride, etc. These materials may be used alone or may be stacked by two or more. Particularly, the barrier metal layer may have a stacked shape of a titanium layer and a titanium nitride layer.

A first metal layer may be formed on the barrier metal layer. Examples of metal materials that may be used for the first metal layer may include tungsten, aluminum, copper, etc. These materials may be used alone or may be stacked by two or more. Particularly, the first metal layer may include tungsten.

Then, the first metal layer and the barrier metal layer may be planarized so that the barrier metal layer and the first metal layer may remain only in the storage node contact hole 212. The planarization process may be conducted through a chemical mechanical polishing process. Through the planarization process, a preliminary barrier metal layer pattern 214 and a preliminary first metal layer pattern 216 may be formed in the storage node contact hole 212.

Figure 28:
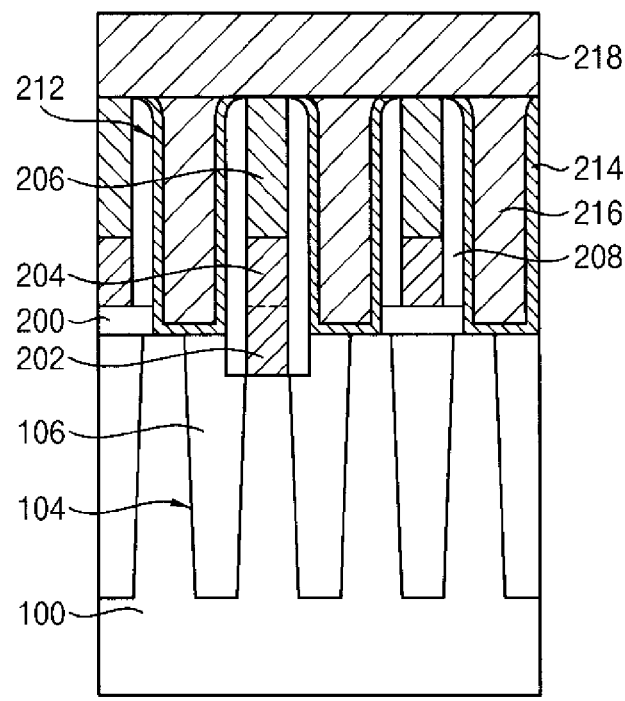

Referring to FIG. 28, on the upper surface of the preliminary barrier metal layer pattern 214 and the preliminary first metal layer pattern 216, the second insulating interlayer (not illustrated), and the hard mask pattern 206, a second metal layer 218 may be formed. The second metal layer 218 may be formed by a chemical vapor deposition process or a physical vapor deposition process.

Examples of metal materials that may be used for the second metal layer 218 may include tungsten, aluminum, copper, etc. These materials may be used alone or may be stacked by two or more. Particularly, the second metal layer 218 may include tungsten. In order to obtain good adhesion properties of the first and second metal layers, the second metal layer 218 may include the same metal material as the first metal layer. Alternatively, the second metal layer 218 may include a different metal material from the first metal layer.

Figure 29:
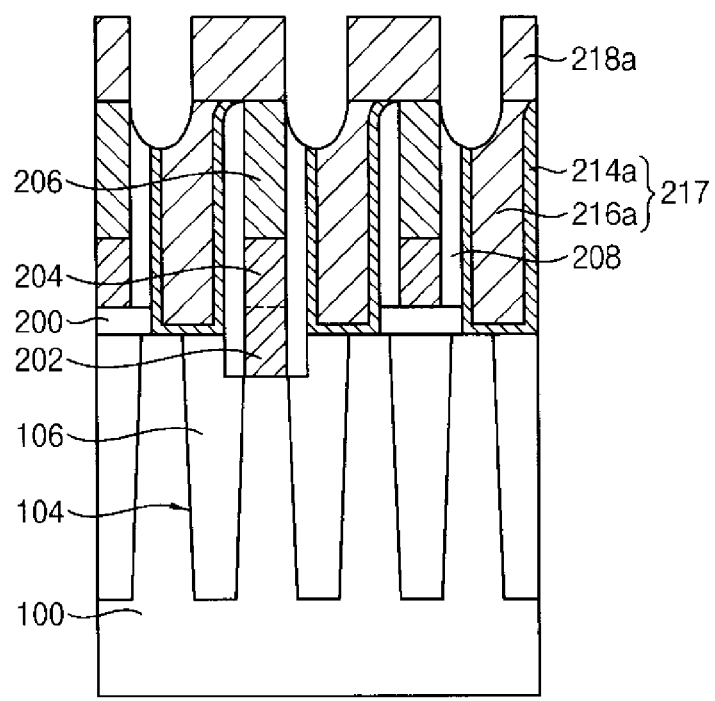

Referring to FIG. 29, an etching mask pattern (not illustrated) may be formed on the second metal layer 218. The etching mask pattern may be provided as a mask pattern for forming the pad pattern. Thus, the etching mask pattern may have an isolated island shape covering at least a portion of the upper surface of the preliminary first metal layer pattern 216 and at least a portion of the upper surface of the second insulating interlayer (not illustrated) and the hard mask pattern (206).

The second metal layer 218 may be etched by using the etching mask pattern. During performing the etching process of the second metal layer 218, a portion of the preliminary first metal layer pattern 216 and the preliminary barrier metal layer 214 positioned in the storage node contact hole 212 may be also removed. In addition, a portion of the insulating spacers 208 and the hard mask pattern 206 may be also removed while etching the second metal layer 218.

Therefore, a storage node contact 217 including a barrier metal layer pattern 214a and a first metal layer pattern 216a may be formed in the storage node contact hole 212. In addition, a pad pattern 218a having an isolated island shape may be formed at the upper surface of the storage node contact 217 and at the upper surface of the second insulating interlayer (not illustrated) and the hard mask pattern. As described above, because the pad pattern 218a may be formed by patterning the second metal layer, a barrier metal layer may not be included. Because the barrier metal layer may not remain between the pad patterns 218a, bridge defects generated by the barrier metal layer may be decreased. In addition, the etching process for forming the pad pattern 218a may be more easily conducted.

Then, as illustrated in FIG. 25, an insulating layer 219 may be formed in a gap between the pad patterns 218a. A capacitor 154 may be formed at the upper surface of the pad pattern 218a. The capacitor 154 may be formed as a cylinder type capacitor or as a stack type capacitor. Through performing the above processes, a DRAM device may be manufactured.

The semiconductor devices in accordance with example embodiments may be mounted on diverse semiconductor packages. In addition, the semiconductor devices in accordance with example embodiments and semiconductor packages including the same may be applied in various types of systems such as a computing system.

Figure 30:
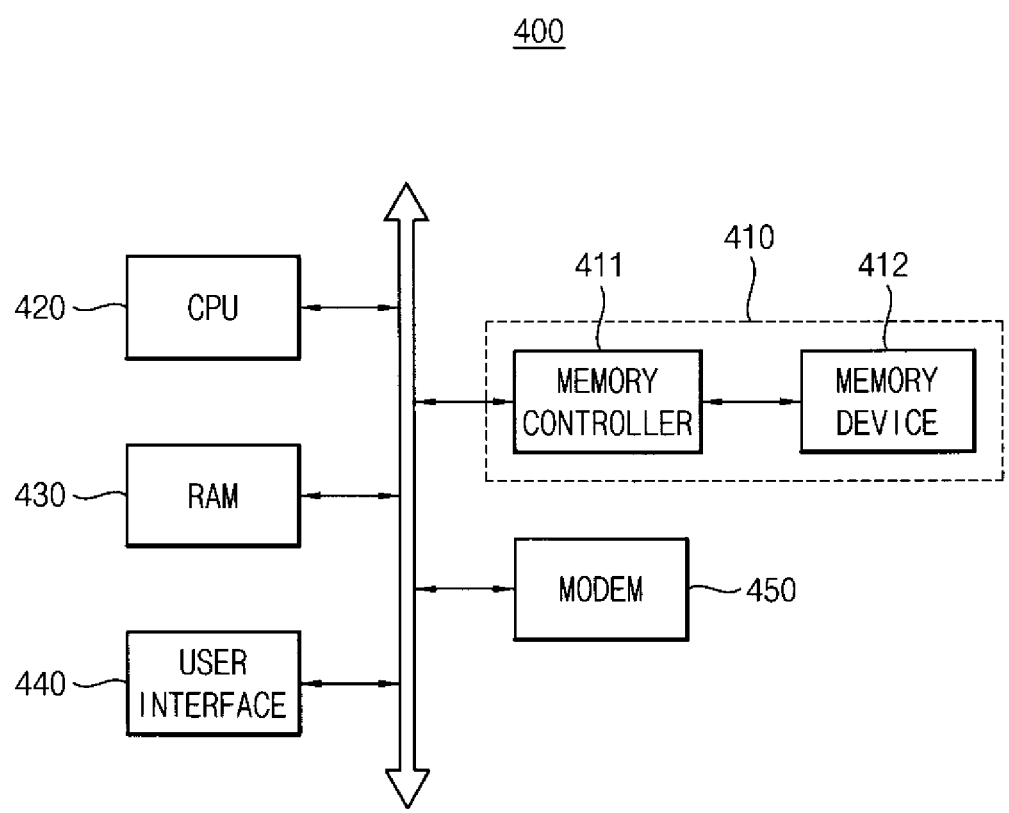

FIG. 30 is a block diagram illustrating a schematic constitution of a computing system in accordance with an example embodiment.

Referring to FIG. 30, a computing system 400 may include a microprocessor (CPU) 420 making an electric connection with a system bus, a RAM 430, a user interface 440, a modem 450 such as a base and chipset and a memory system 410. The memory system 410 may include a memory device 412 and a memory controller 411. The memory device 412 may include a semiconductor device or a DRAM device in accordance with example embodiments. The memory controller 411 may be constituted so as to control the memory device 412. Through the combination of the memory device 412 and the memory controller 411, the memory system 410 may be provided as a memory card or a semiconductor disk device including a solid state disk (SSD). When the computing system 400 is a mobile apparatus, a battery for supplying an operation voltage of the computing system 400 may be additionally provided. Even though not illustrated, the computing system 400 in accordance with example embodiments may further include an application chipset, a camera image processor (CIS), a mobile DRAM, and the like.

As described above, a semiconductor device of a structure having a decreased parasitic capacitance may be provided. The semiconductor device may be used in various memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
an insulating interlayer over a substrate in a cell region, the insulating interlayer including contact holes exposing a portion of a surface of the substrate;
contact plugs in the contact holes, the contact plugs including a stacked structure of a first barrier metal layer pattern and a first metal layer pattern;
second metal layer patterns directly contacting the contact plugs and an upper surface of the insulating interlayer, the second metal layer pattern being a metal material layer, without a barrier metal material, and an area of a bottom region of each of the second metal layer patterns contacting a respective one of the contact plugs is about 30% to about 70% of a total area of the bottom portion of each of the second metal layer patterns,
a gate insulating layer on the substrate in a core/peripheral region; and
gate electrode structures each including a stacked structure of a lower gate pattern, a second barrier metal layer pattern, a third metal layer pattern, and a fourth metal layer pattern on the gate insulating layer, the first and second barrier metal layer patterns including the same materials.

2. The semiconductor device of claim 1, wherein the second and fourth metal layer patterns include the same metal materials.

3. The semiconductor device of claim 1, wherein a height of the second metal layer patterns is smaller than a height of a stacked structure of the third and fourth metal layer patterns.

4. The semiconductor device of claim 1, wherein the second metal layer patterns each have a line shape.

5. The semiconductor device of claim 1, wherein the second metal layer patterns each have an isolated island shape contacting a respective one of the contact plugs and the insulating interlayer.

6. The semiconductor device of claim 1, further comprising:
inner spacers each on a side wall of a respective one of the contact holes, the inner spacers including an insulating material.

7. A semiconductor device, comprising:
an insulated bit line contact plug including a first metal layer pattern stacked over an ohmic contact layer pattern on a substrate in a cell region;
a metal bit line contact layer pattern over the insulated bit line contact plug, the metal bit line contact layer pattern directly contacting the ohmic contact layer pattern and the first metal layer pattern, the metal bit line contact layer pattern being a metal material layer without a barrier metal material, and an area of a bottom surface of the metal bit line contact layer pattern directly contacting the ohmic contact layer pattern and the first metal layer pattern, collectively, being about 30% to about 70% of a total area of the bottom surface of the metal bit line contact layer pattern;
a gate insulating layer on the substrate in a core/peripheral region; and
gate electrode structures each including a stacked structure of a lower gate patter, a barrier metal layer pattern, a second metal layer pattern, and a third metal layer pattern on the gate insulating layer, the barrier metal layer pattern and the ohmic contact layer pattern including the same material.

8. The semiconductor device of claim 7, wherein the ohmic contact layer pattern is provided in an area excluding between the first metal layer pattern and the metal bit line contact layer pattern.

9. The semiconductor device of claim 7, wherein,
the ohmic contact layer pattern has two integrally-formed prongs directly contacting the metal bit line contact layer pattern, and
an area of a surface of the first metal layer pattern directly contacting the metal bit line contact layer pattern is greater than an area of a surface of the ohmic contact layer pattern directly contacting the metal bit line contact layer pattern.

10. The semiconductor device of claim 7, further comprising:
spacers each along both a sidewall of the insulated bit line contact plug and a sidewall of the metal bit line contact layer pattern; and
an insulating interlayer with the insulated bit line contact plug and the spacers recessed therein.

* * * * *